United States Patent
Kawanabe et al.

(10) Patent No.: US 9,726,767 B2
(45) Date of Patent: Aug. 8, 2017

(54) RADIATION IMAGING APPARATUS AND RADIATION IMAGING SYSTEM

(71) Applicant: CANON KABUSHIKI KAISHA, Tokyo (JP)

(72) Inventors: Jun Kawanabe, Kumagaya (JP); Minoru Watanabe, Honjo (JP); Keigo Yokoyama, Honjo (JP); Masato Ofuji, Takasaki (JP); Kentaro Fujiyoshi, Tokyo (JP); Hiroshi Wayama, Honjo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 93 days.

(21) Appl. No.: 14/810,579

(22) Filed: Jul. 28, 2015

(65) Prior Publication Data

US 2016/0041276 A1 Feb. 11, 2016

(30) Foreign Application Priority Data

Aug. 6, 2014 (JP) .................................. 2014-160798

(51) Int. Cl.
*G01T 1/24* (2006.01)
*G01T 1/02* (2006.01)
(Continued)

(52) U.S. Cl.
CPC .............. *G01T 1/247* (2013.01); *G01T 1/023* (2013.01); *G01T 1/026* (2013.01); *G01T 1/17* (2013.01);
(Continued)

(58) Field of Classification Search
CPC .... H04N 5/3597; H04N 5/374; H04N 5/2251; H04N 5/361; A61B 6/4233; G01T 1/247;
(Continued)

(56) References Cited

U.S. PATENT DOCUMENTS

| 7,205,568 B2 | 4/2007 | Watanabe et al. ............... 257/59 |
| 7,488,948 B2 | 2/2009 | Ishii et al. ............... 250/370.11 |

(Continued)

FOREIGN PATENT DOCUMENTS

JP 2012-052896 3/2012

OTHER PUBLICATIONS

U.S. Appl. No. 14/696,976, filed Apr. 27, 2015.
U.S. Appl. No. 14/817,301, filed Aug. 4, 2015.

*Primary Examiner* — Hoon Song
(74) *Attorney, Agent, or Firm* — Fitzpatrick, Cella, Harper & Scinto

(57) ABSTRACT

A radiation imaging apparatus includes a unit constituted by arranging blocks in line and an information processing unit. Each of the blocks includes a conversion element configured to generate an image signal corresponding to radiation, a switching element connected between the conversion element and a column signal line, a detection element configured to detect radiation, and a detection signal line connected to the detection element. The information processing unit corrects a signal from the detection element, by using a value of the signal based on a parasitic capacitance between the conversion elements arranged on the same column as a column of the detection element.

15 Claims, 19 Drawing Sheets

(51) Int. Cl.
*G01T 1/17* (2006.01)
*H04N 5/32* (2006.01)
*H04N 5/365* (2011.01)
*H04N 5/369* (2011.01)
*H04N 5/378* (2011.01)
*H01L 27/146* (2006.01)

(52) U.S. Cl.
CPC .. *H01L 27/14603* (2013.01); *H01L 27/14658* (2013.01); *H01L 27/14659* (2013.01); *H04N 5/32* (2013.01); *H04N 5/365* (2013.01); *H04N 5/3696* (2013.01); *H04N 5/378* (2013.01)

(58) Field of Classification Search
CPC G01T 1/17; G01T 1/023; G01T 1/026; G01T 1/241; G01T 1/244; G01T 1/2928
See application file for complete search history.

(56) References Cited

U.S. PATENT DOCUMENTS

| | | | |
|---|---|---|---|
| 7,535,506 B2 | 5/2009 | Nomura et al. | 348/308 |
| 7,557,355 B2 | 7/2009 | Mochizuki et al. | 250/370.09 |
| 7,629,564 B2 | 12/2009 | Mochizuki et al. | 250/208.1 |
| 7,645,995 B2 | 1/2010 | Yagi et al. | 250/370.09 |
| 8,067,743 B2 | 11/2011 | Ishii et al. | 250/370.09 |
| 8,680,472 B2 | 3/2014 | Mochizuki et al. | 250/370.09 |
| 2002/0093581 A1* | 7/2002 | Ikeda | H04N 5/357 348/302 |
| 2007/0069107 A1* | 3/2007 | Ishii | H01L 27/14658 250/208.1 |
| 2009/0140155 A1* | 6/2009 | Yagi | H04N 3/1568 250/370.09 |
| 2012/0049077 A1 | 3/2012 | Okada | 250/370.08 |

* cited by examiner

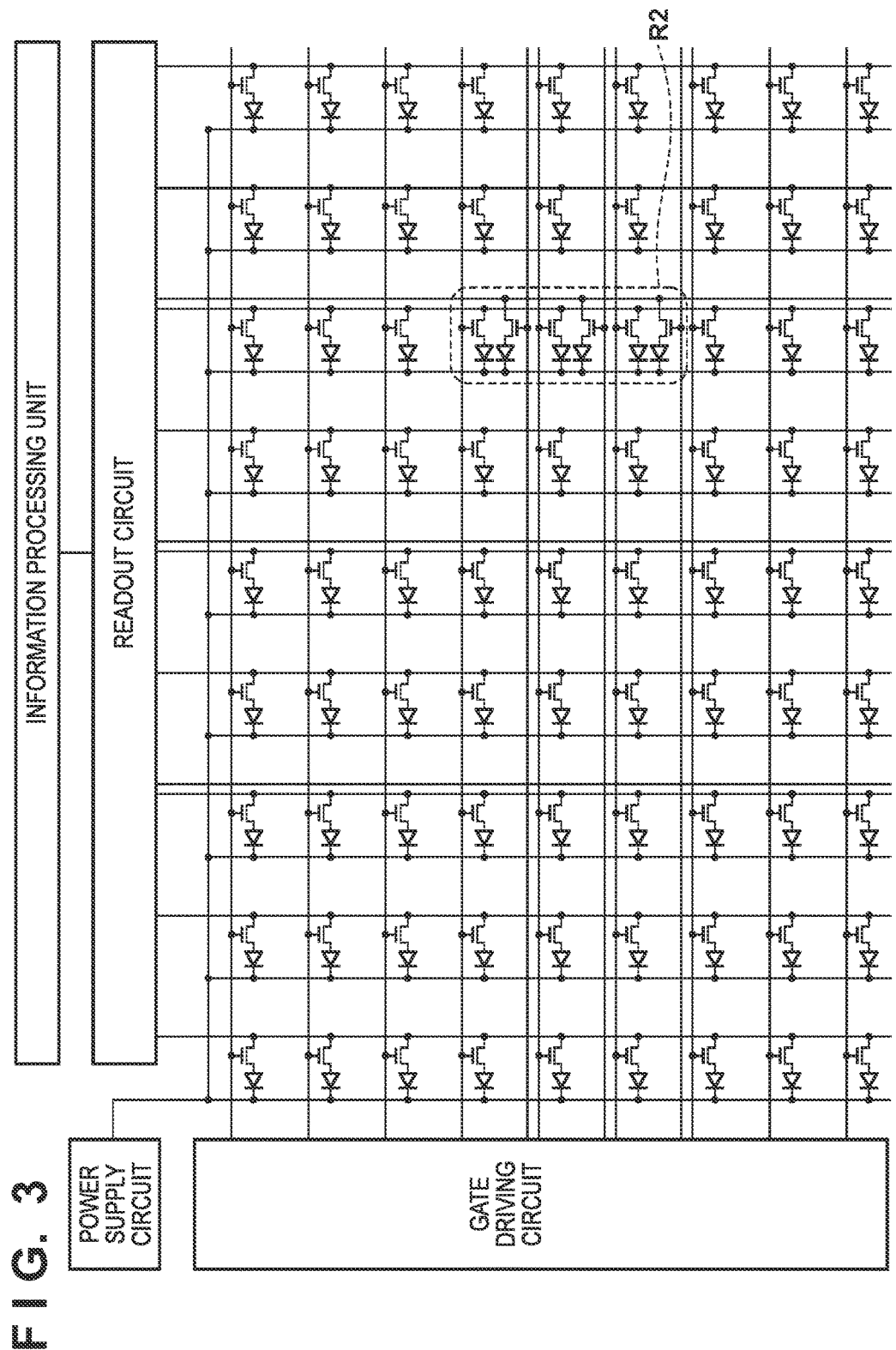
F I G. 3

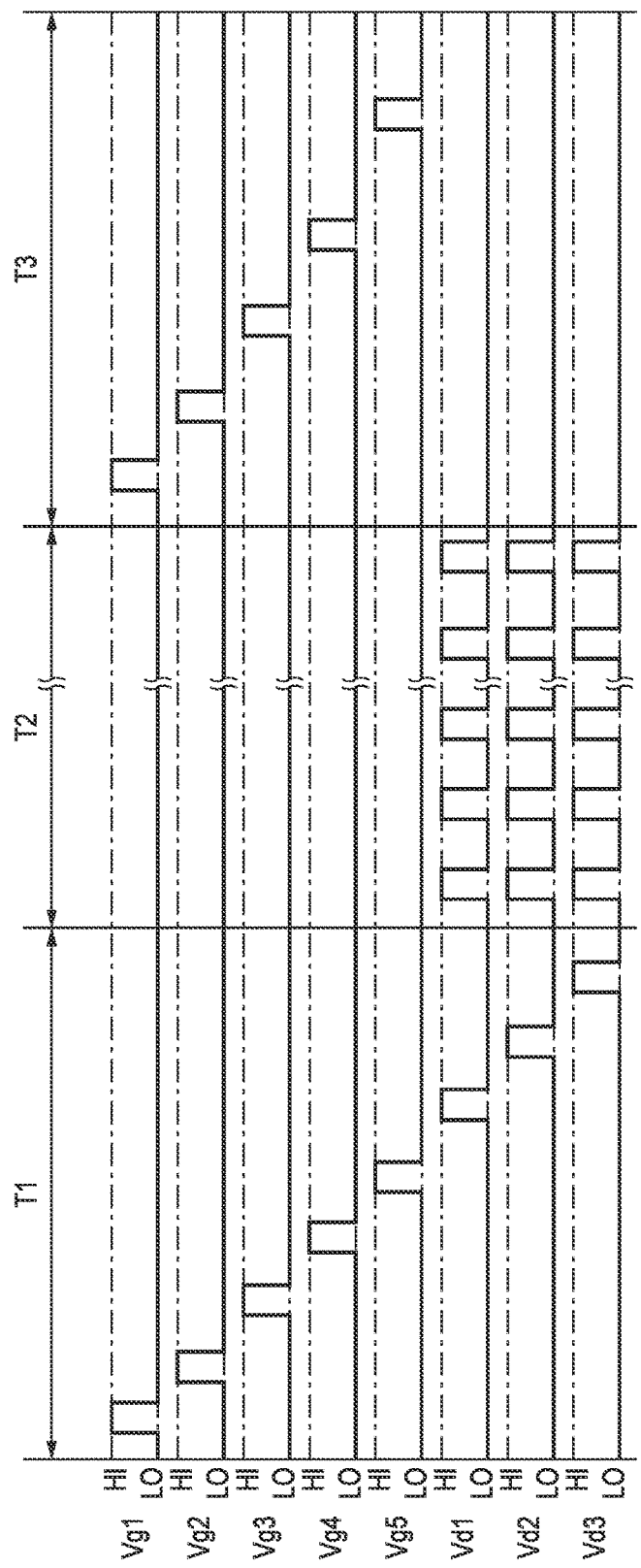

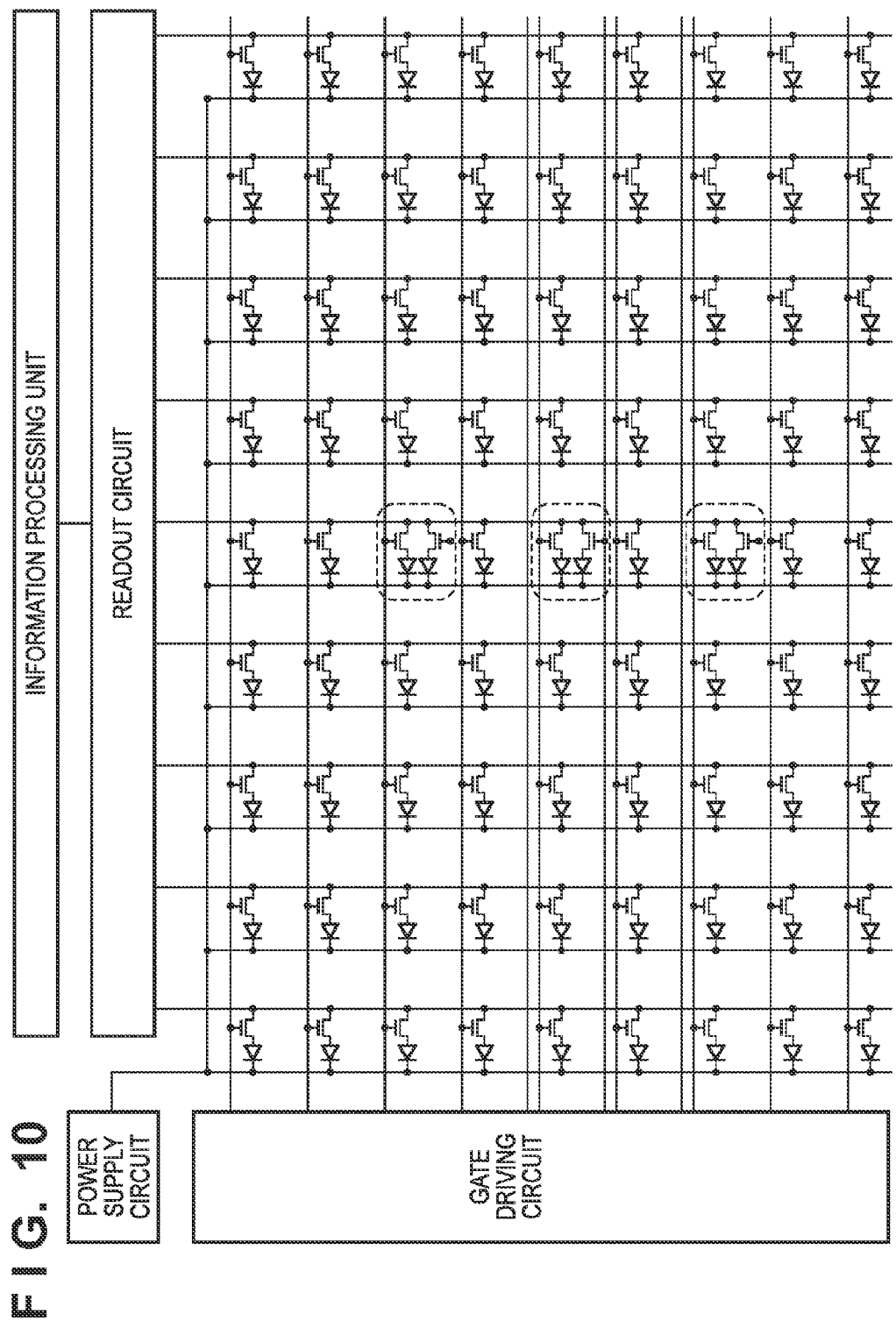

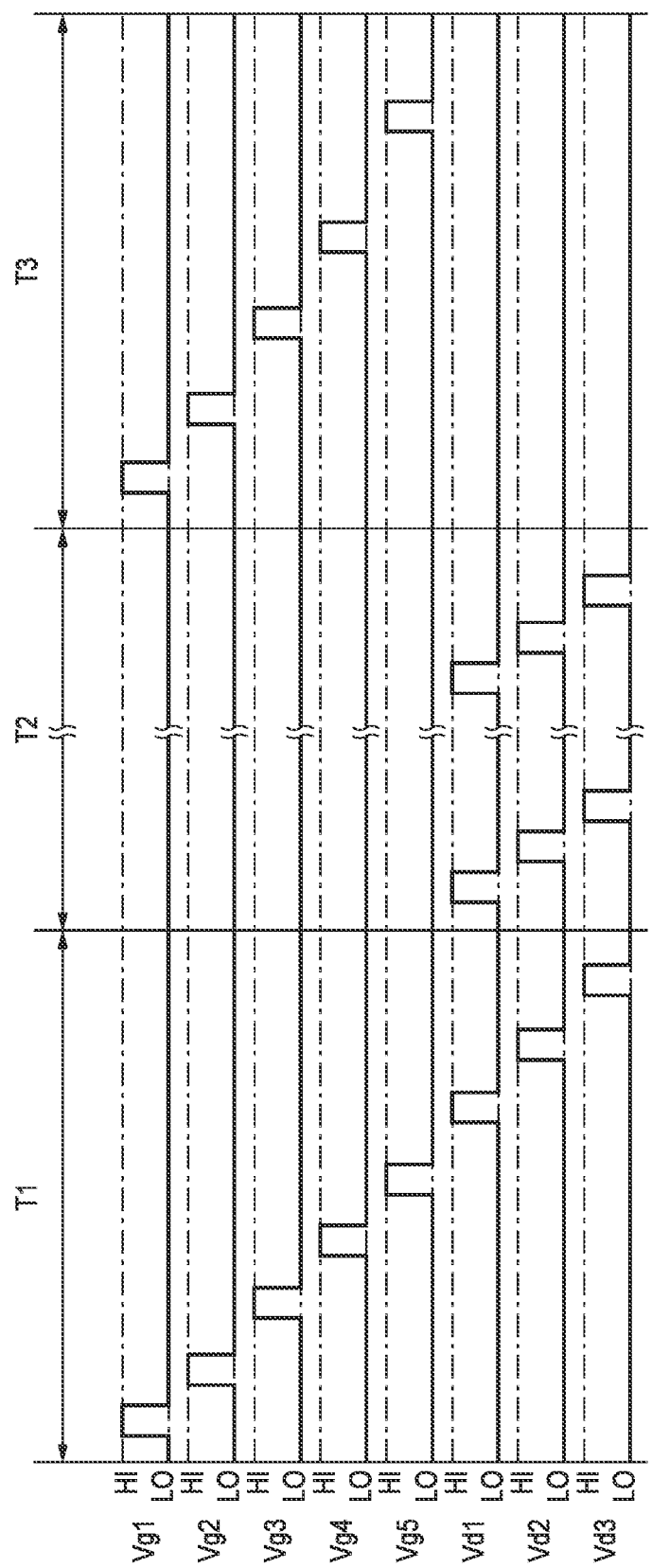

RADIATION IMAGING APPARATUS AND RADIATION IMAGING SYSTEM

BACKGROUND OF THE INVENTION

Field of the Invention

The present invention relates to a radiation imaging apparatus and a radiation imaging system.

Description of the Related Art

A detection apparatus constituted by combining a conversion element that converts radiation into charges, a switching element such as a thin-film transistor, a pixel array in which wiring lines are provided, a driving circuit, and a readout circuit is widely used as a radiation detection apparatus. Recently, multi-functionality of such a detection apparatus is being examined. As one of these functions, it is examined that the detection apparatus incorporates a function of detecting and measuring information about irradiation by the detection apparatus while a radiation source emits radiation. For example, the timing to start irradiation with radiation from the radiation source is detected, and the radiation dose or the integrated irradiation amount is measured. This function also makes it possible to monitor the integrated amount of the dose, and when the integrated amount reaches a predetermined amount, control the radiation source by the detection apparatus, and end the irradiation.

A wiring line for reading out a detection signal from a detection element that detects radiation is wired through a given region of pixels for image formation up to a readout circuit outside the pixels. Measurement of the radiation dose needs to be performed in real time during radiation irradiation. That is, the dose needs to be measured while the pixels for image formation are irradiated with radiation and the potentials of the electrodes of the pixels vary at any time upon the radiation irradiation. For this reason, crosstalk is generated by capacitive coupling between the wiring line for reading out a detection signal and the electrode of the pixel for image formation, and influences quantitative measurement of the radiation dose, resulting in poor measurement accuracy.

Japanese Patent Laid-Open No. 2012-52896 discloses an arrangement in which a sensor for detecting radiation is incorporated in a pixel array in order to detect the timing to start irradiation with radiation, and a signal from the sensor is read via a wiring line connected to the sensor. This patent literature discloses that the influence of noise superposed on the wiring line is suppressed by calculating a difference between electrical signals respectively generated on a signal line connected to the sensor and a signal line not connected to the sensor.

In the above-mentioned patent literature, the signal line connected to the sensor and the signal line not connected to the sensor are provided, so extra signal lines are added. Also, an input circuit for processing a signal is also required in accordance with a signal.

SUMMARY OF THE INVENTION

One aspect of the present invention provides a radiation imaging apparatus including a unit constituted by arranging blocks in line, and an information processing unit, wherein each of the blocks includes a conversion element configured to generate an image signal corresponding to radiation, a switching element connected between the conversion element and a column signal line, a detection element configured to detect radiation, and a detection signal line connected to the detection element, and the information processing unit corrects a signal from the detection element that is provided from the detection signal line, by using a value of the signal from the detection element that is provided from the detection signal line, and a value of a signal based on a parasitic capacitance between the conversion element arranged on the same column as a column of the detection element, and the detection signal line connected to the detection element.

Further features of the present invention will become apparent from the following description of exemplary embodiments (with reference to the attached drawings).

BRIEF DESCRIPTION OF THE DRAWINGS

FIG. 3 is an enlarged view showing a block A in FIG. 2;

FIG. 7 is a timing chart showing a radiation imaging apparatus according to the first embodiment;

FIG. 10 is an enlarged view showing a block A in FIG. 9;

FIG. 12 is a timing chart showing the radiation imaging apparatus according to the second embodiment of the present invention;

DESCRIPTION OF THE EMBODIMENTS

Embodiments of the present invention will be described in detail with reference to the accompanying drawings. In this specification, radiation includes α-rays, β-rays, and γ-rays, which are beams formed by particles (including photons) emitted by radioactive decay, and also includes beams having energy equal to or higher than the energies of these beams, such as X-rays, particle rays, and cosmic rays.

(First Embodiment)

Figure 1:
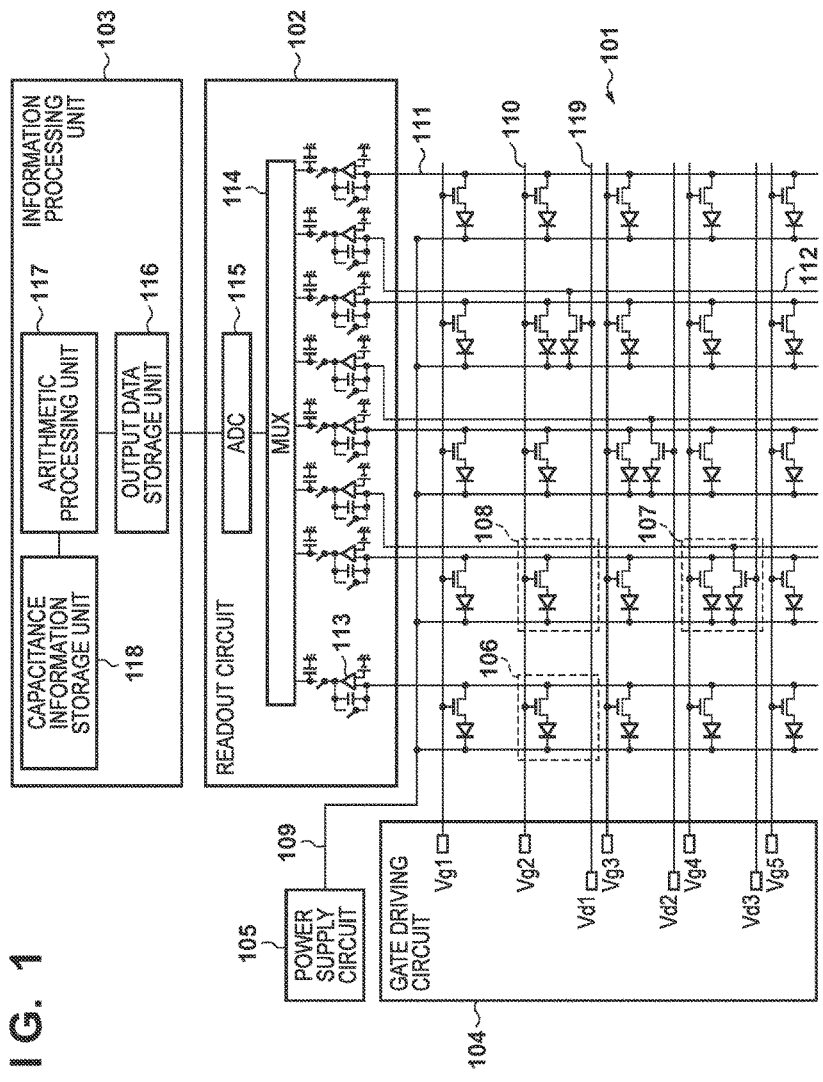
FIG. 1 is an equivalent circuit diagram showing a radiation detection apparatus according to the first embodiment of the present invention.

The first embodiment of the present invention will be described first. FIG. 1 is an equivalent circuit diagram showing the circuit arrangement of a radiation detection apparatus according to this embodiment. The radiation detection apparatus according to this embodiment is constituted by a pixel area 101 in which pixels are arranged in a matrix on a support substrate, a readout circuit 102, an information processing unit 103, a gate driving circuit 104, and a power supply circuit 105. Although FIG. 1 shows an example in which 5 (rows)×5 (columns) pixels are arranged in the pixel area 101, the number of pixels is not limited to this.

In a pixel 106, an imaging photoelectric conversion element is connected to a corresponding column signal line 111 via a switch such as a TFT (Thin-Film Transistor). In a pixel 107, a photoelectric conversion element for generating an image signal is connected to the corresponding column signal line 111 via a TFT. Further, a photoelectric conversion element serving as a detection element for detecting radiation is connected to a detection signal line 112 via a TFT. In a pixel 108, the detection signal line 112 is wired inside the pixel 108, in addition to the arrangement of the pixel 106. The layout of the pixels 106 to 108 is merely an example and is not limited to this. The imaging photoelectric conversion elements of the pixels 106 and 108, and the photoelectric conversion element for detecting radiation in the pixel 107 are connected to a common bias line 109, and receive a predetermined bias potential from the power supply circuit 105. In this embodiment, photoelectric conversion elements that convert light into charges are used as the imaging conversion element and the detection element for detecting radiation. However, the conversion element and the detection element are not limited to the photoelectric conversion elements. As the conversion element and the detection element, direct conversion elements that convert radiation directly into charges may also be used.

The control electrodes of TFTs arranged on a predetermined row are connected to a common gate wiring line 110, and the gate driving circuit 104 controls ON/OFF of their gates. The gate driving circuit 104 also controls ON/OFF of the gate of the TFT connected to the detection photoelectric conversion element of the pixel 107. In this specification, an array of pixels arranged in a direction in which the column signal line 111 runs will be called a column, and an array of pixels arranged in a direction (direction in which the gate wiring line 110 runs) perpendicular to this direction will be called a row.

The column signal lines 111 of the pixels 106 to 108 and the detection signal line 112 of the pixel 107 are connected to the readout circuit 102. The readout circuit 102 includes at least operational amplifiers 113 provided at the initial stage of the input, a multiplexer (MUX) 114, and an A/D converter (ADC) 115. The column signal lines 111 and the detection signal lines 112 are connected to the inverting input terminals and feedback capacitors of the operational amplifiers 113 at the initial stage, respectively. The other electrode of each feedback capacitor is connected to an output terminal. The non-inverting input terminals of the operational amplifiers 113 at the initial stage are connected to a reference power supply. The output terminals of the operational amplifiers 113 are connected to the ADC 115 via the MUX 114. The ADC 115 converts output signals from the operational amplifiers 113 into digital signals.

Digital data converted by the ADC 115 is input to the information processing unit 103. The information processing unit 103 includes at least a capacitance information storage unit 118 that stores capacitance information for correcting crosstalk, an output data storage unit 116 that temporarily stores data from the ADC, and an arithmetic processing unit 117. The arithmetic processing unit 117 is connected to the capacitance information storage unit 118 and the output data storage unit 116, and allows data exchange between the capacitance information storage unit 118 and the output data storage unit 116, as needed.

Figure 2:
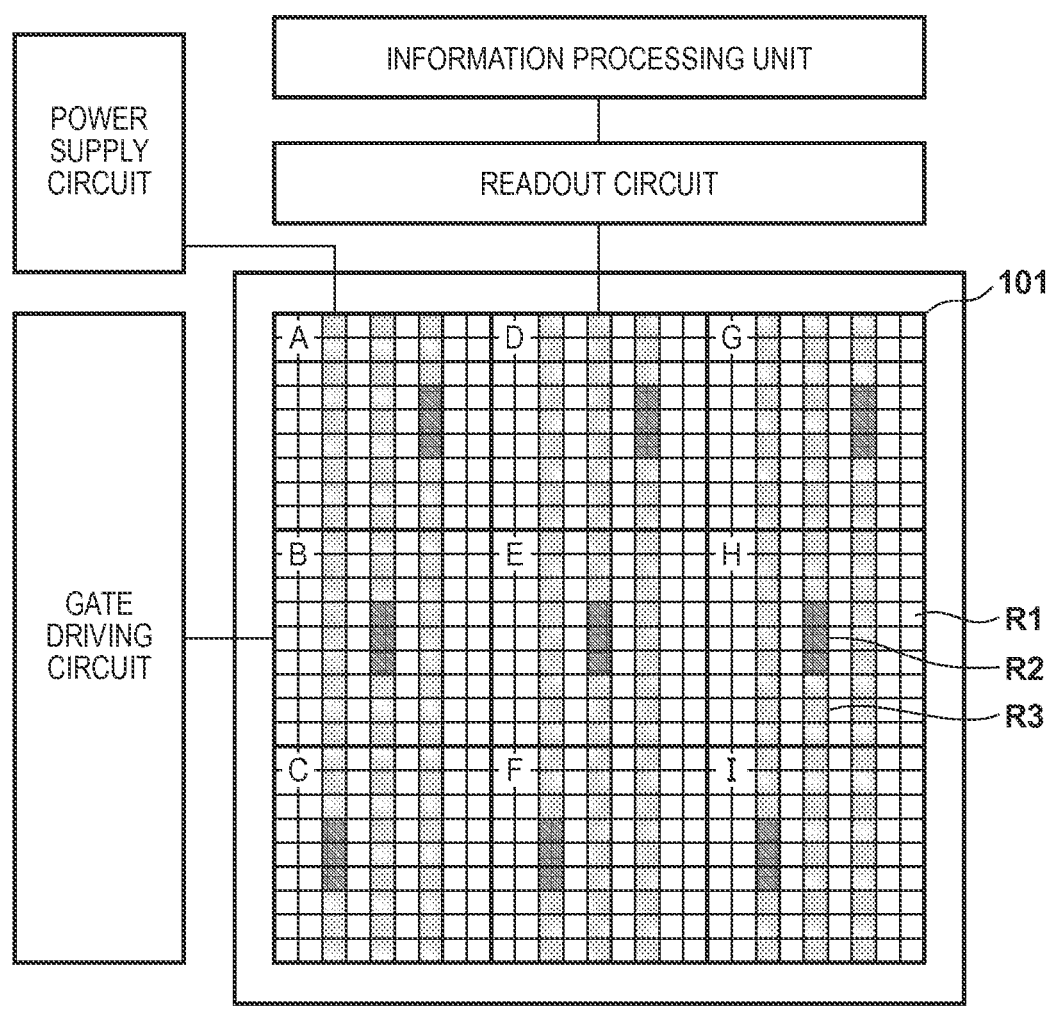
FIG. 2 is a view showing the layout of the radiation detection apparatus according to the first embodiment of the present invention.

When a circuit having the arrangement as shown in FIG. 1 is applied to, for example, a radiation detection apparatus including 27×27 pixels, an arrangement as shown in FIG. 2 is obtained. Although 27×27 pixels are arranged in this embodiment, the number of pixels is not limited to this. For example, the number of pixels may be 1000×1000 or 5000×5000. In this embodiment, the region of 27×27 pixels is constituted by nine blocks A to I each constituted by 9×9 pixels. FIG. 3 is an equivalent circuit diagram showing a portion indicated by the block A in FIG. 2. In this embodiment, a set of the blocks A to C, a set of the blocks D to F, and a set of the blocks G to I will be called units, respectively. In this embodiment, a crosstalk signal can be corrected for each unit.

The pixel area 101 in FIG. 2 includes a region R1 where the pixels 106 are gathered, a region R2 where the pixels 107 are gathered, and a region R3 where the pixels 108 are gathered. FIG. 2 shows an example in which one region R2 exists in each block of the pixel area 101, and 3×3=9 regions R2 exist in the pixel areas 101. However, the number and layout of the regions R2 are not limited to this example. For example, 5×5=25 regions R2 may be provided in accordance with the pixel area 101, or 10×10=100 regions R2 may be provided. As for the layout of the regions R2 at this time, the regions R2 may be laid out uniformly in the pixel area, or may be localized to a given portion densely. FIG. 3 shows an example in which three pixels 107 are successively arranged in the column direction within the region R2. However, the number and layout of the pixels 107 are not limited to this example. The pixels 107 may be arranged on every other pixel along the column, or may be arranged along the row.

Figure 4A:
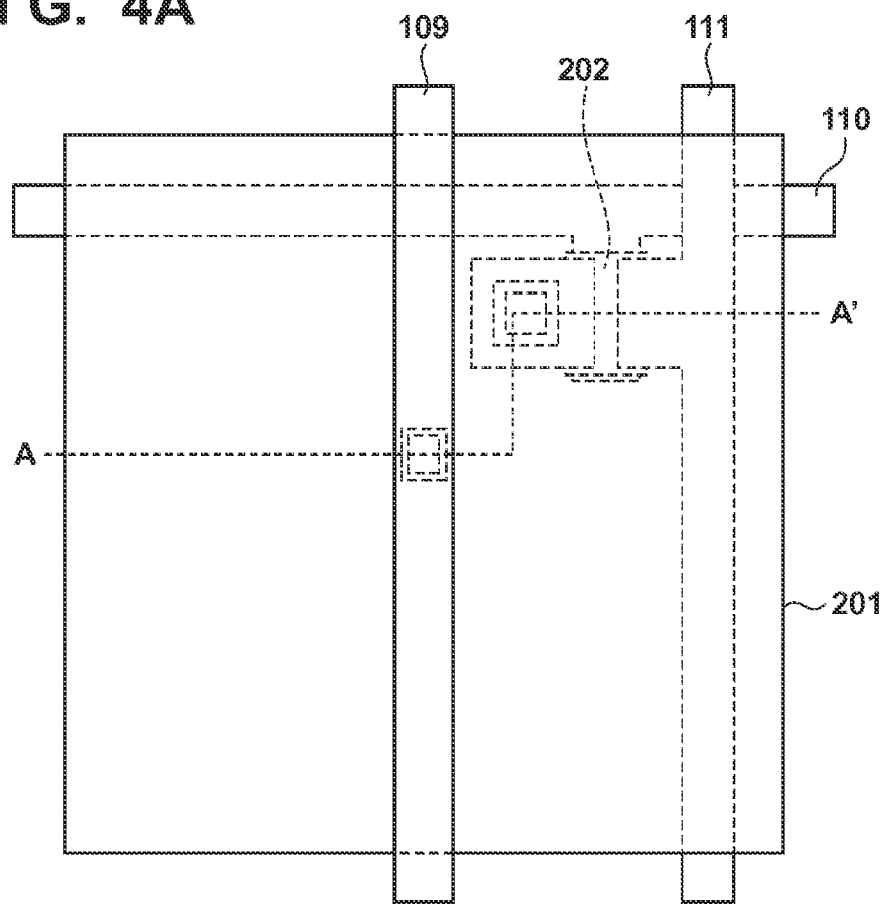
FIGS. 4A and 4B are schematic views showing a pixel 106 according to the first embodiment.
Figure 4B:
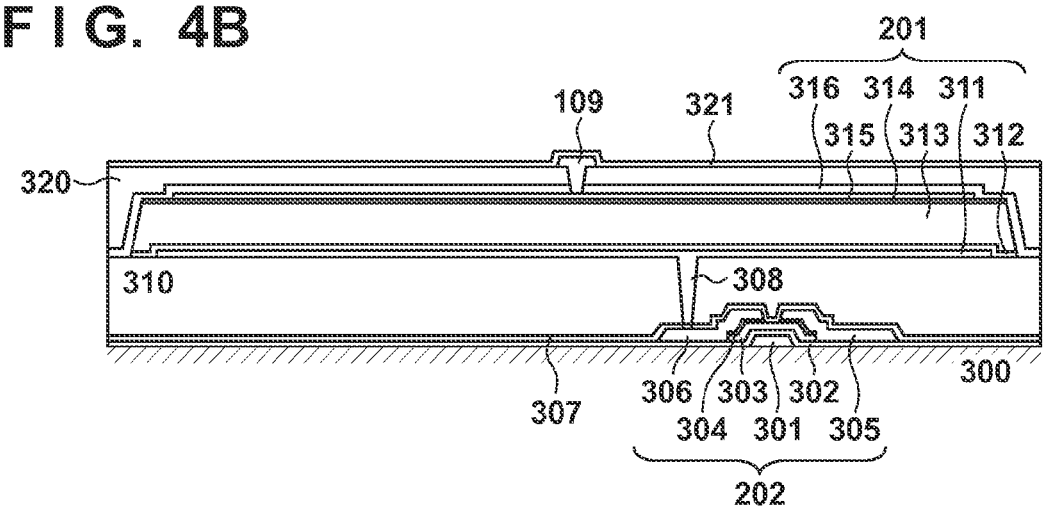

Next, the structures of the pixels 106 to 108 will be explained. FIG. 4A is a plan view showing the pixel 106, and FIG. 4B is a sectional view taken along a line A-A' in FIG. 4A. The pixel 106 includes an imaging photoelectric conversion element 201, and a TFT 202 serving as a switching element for outputting an electrical signal in accordance with the charges of the imaging photoelectric conversion element 201. The imaging photoelectric conversion element 201 is stacked and arranged on the TFT 202 provided on an insulating substrate 300 such as a glass substrate. The TFT 202 is formed on the substrate 300. The TFT 202 includes, in order from the substrate 300, a control electrode 301, a first insulating layer 302, a first semiconductor layer 303, a first impurity semiconductor layer 304 higher in impurity concentration than the first semiconductor layer 303, a first main electrode 305, and a second main electrode 306.

The first impurity semiconductor layer 304 is in contact with the first main electrode 305 and the second main electrode 306 in a partial region. A region of the first semiconductor layer 303 between the first main electrode 305 and the second main electrode 306 where the first semiconductor layer 303 contacts the first impurity semiconductor layer 304 serves as the channel region of the TFT 202. The control electrode 301 is electrically joined to the gate wiring line 110. The first main electrode 305 is electrically joined to the column signal line 111. The second main electrode 306 is electrically joined to a discrete electrode 311 of the photoelectric conversion element via a contact formed in a contact hole 308.

In this embodiment, the first main electrode 305, the second main electrode 306, and the column signal line 111 are constituted by the conductive layer, and the first main electrode 305 forms part of the column signal line 111. A second insulating layer 307 and the first interlayer insulation layer 310 are arranged on the first main electrode 305, the second main electrode 306, and the column signal line 111 in order from the column signal line 111. The second insulating layer 307 is provided to cover the TFT 202, the gate wiring line 110, and the column signal line 111.

This embodiment adopts, as the switching element, the inversely staggered TFT 202 that is mainly made of amorphous silicon and uses a semiconductor layer and an impurity semiconductor layer. However, the present invention is not limited to this. For example, a staggered TFT mainly made of polysilicon, an organic TFT, an oxide TFT, or the like can be used. The first interlayer insulation layer 310 is arranged between the substrate and the discrete electrode 311 so as to cover the TFT, and has the contact hole 308. The discrete electrode 311 of the imaging photoelectric conversion element 201 and the second main electrode 306 are electrically joined by the contact formed in the contact hole 308 provided in the first interlayer insulation layer 310. The imaging photoelectric conversion element 201 includes the discrete electrode 311, a second impurity semiconductor layer 312, a second semiconductor layer 313, a third impurity semiconductor layer 314, and a common electrode 315 on the first interlayer insulation layer 310 in order from the first interlayer insulation layer 310. The discrete electrode 311 and the common electrode 315 face each other, and have a capacitance between these electrodes. A fourth insulating layer 316 is arranged on the common electrode 315 of the imaging photoelectric conversion element 201. The common electrode 315 of the imaging photoelectric conversion element 201 is electrically joined to the bias line 109 arranged on a second interlayer insulation layer 320. A fifth insulating layer 321 serving as a protective film is arranged on the bias line 109.

Figure 5A:
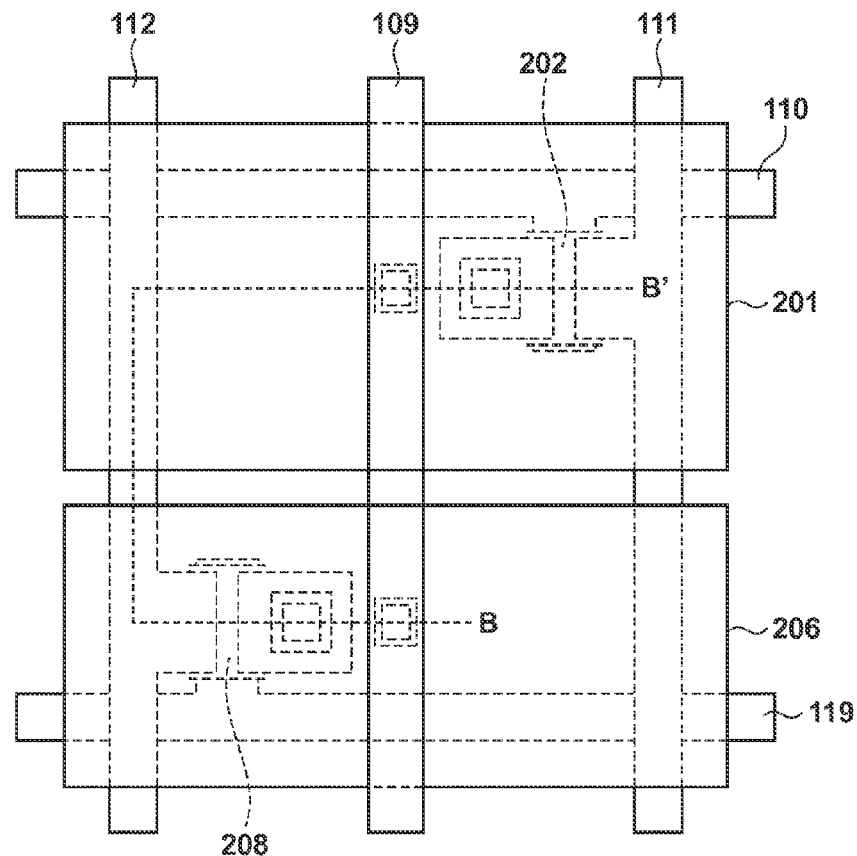
FIGS. 5A and 5B are schematic views showing a pixel 107 according to the first embodiment.
Figure 5B:
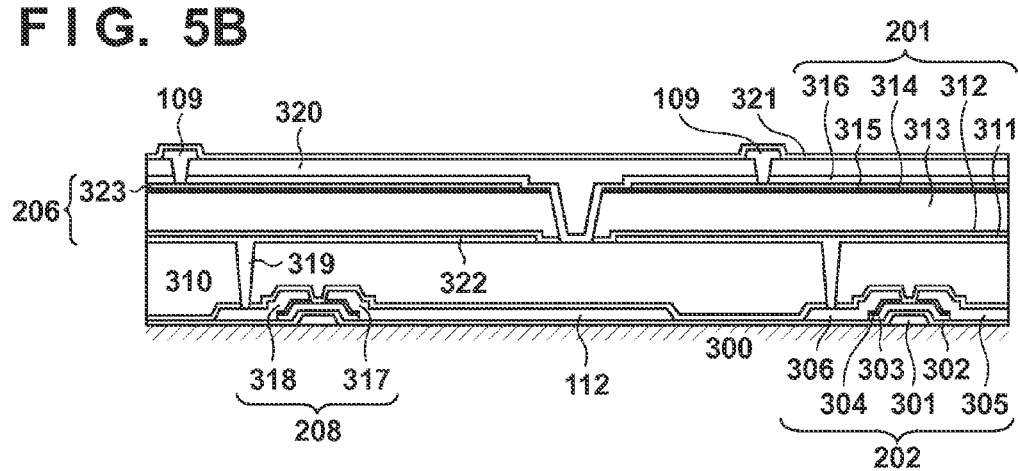

Next, the structure of the pixel 107 will be explained. FIG. 5A is a plan view showing the pixel 107, and FIG. 5B is a sectional view taken along a line B-B' in FIG. 5A. The pixel 107 in this embodiment includes the imaging photoelectric conversion element 201, the TFT 202 connected to the imaging photoelectric conversion element 201, a detection photoelectric conversion element 206, and a TFT 208 connected to the detection photoelectric conversion element 206.

The detection photoelectric conversion element 206 is stacked and arranged on the TFT 208 provided on the insulating substrate 300 which may be a glass substrate. A first main electrode 317 of the TFT forms part of the detection signal line 112. A second main electrode 318 of the TFT is connected to a first electrode 322 of the detection photoelectric conversion element 206 via a contact formed in a contact hole 319. The bias line 109 arranged on the second interlayer insulation layer 320 is electrically joined to the common electrode 315 of the imaging photoelectric conversion element 201 and a common electrode 323 of the detection photoelectric conversion element 206. The discrete electrode 311 of the imaging photoelectric conversion element 201 and the common electrode 315 face each other, and have a capacitance between these electrodes. There is also a capacitance between the discrete electrode 322 and the common electrode 323 that are arranged to face each other.

In this embodiment, the detection photoelectric conversion element 206 is a PIN sensor. One electrode of the detection photoelectric conversion element 206 is connected via the bias line 109 to the power supply circuit 105 that supplies a bias potential, and the other electrode is connected to the readout circuit 102 via the TFT 208 and the detection signal line 112. Radiation is converted into visible light by a phosphor. When the converted radiation enters the detection photoelectric conversion element 206, electrons and holes generated in the semiconductor layer are read by an applied electric field. That is, electrons and holes move to the respective electrodes of the detection photoelectric conversion element 206 in accordance with the potential difference between a bias potential applied from the power supply circuit 105 via the bias line 109, and a potential applied from the readout circuit 102. By reading the charges by the readout circuit 102 in real time, the radiation dose can be measured.

Figure 6A:
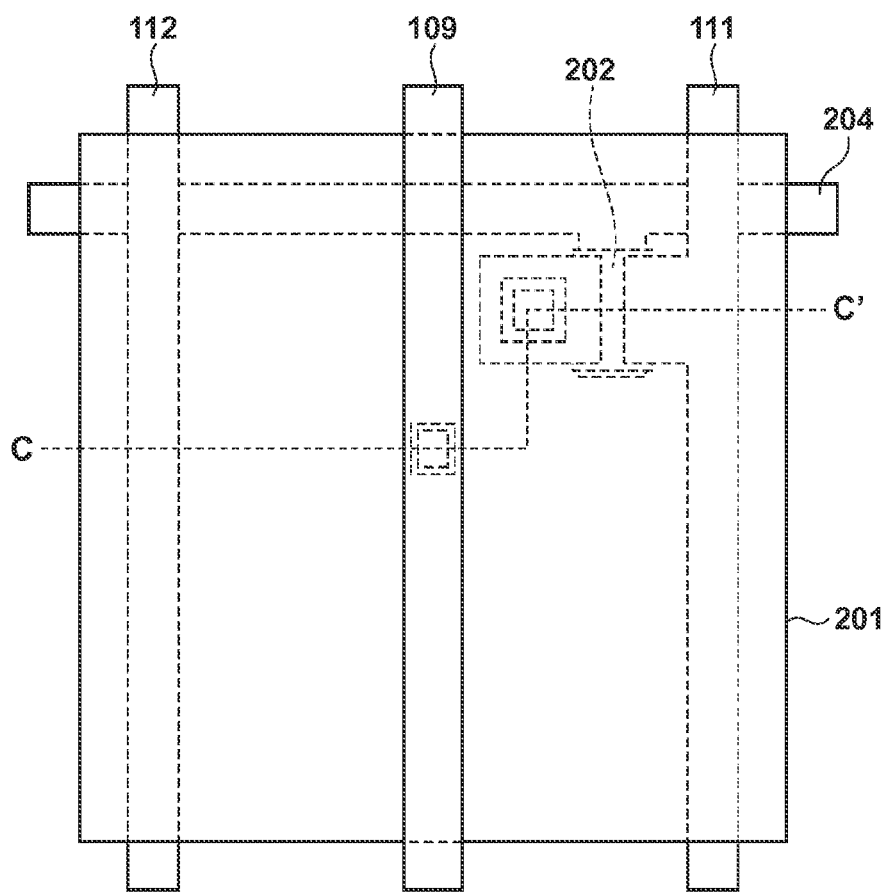
FIGS. 6A and 6B are schematic views showing a pixel 108 according to the first embodiment.
Figure 6B:
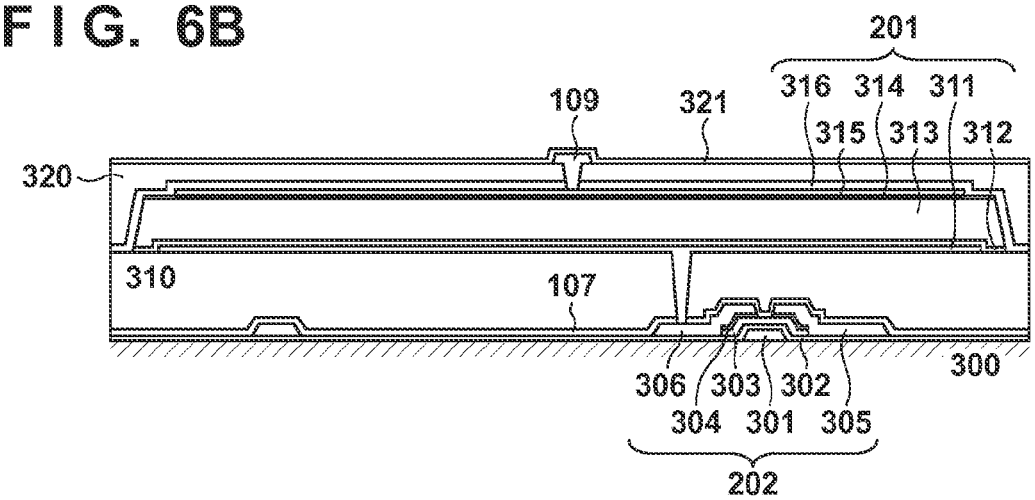

Next, the arrangement of the pixel 108 according to this embodiment will be explained with reference to FIGS. 6A and 6B. The pixel 108 includes the imaging photoelectric conversion element 201 and the TFT 202. The pixel 108 has a structure in which the detection signal line 112 running from the pixel 107 is wired inside the pixel 108, in addition to the same structure as that of the pixel 106. Since the opening area of the imaging photoelectric conversion element 201 of the pixel 107 is small with respect to the imaging photoelectric conversion elements 201 of the pixels 106 and 108 in this embodiment, the amount of an image signal obtained from the pixel 107 decreases. In this case, the decreased data needs to be corrected, and an image processing technique can cope with this correction. There is a capacitance between the discrete electrode 311 and the common electrode 315 that are arranged to face each other.

This embodiment adopts, as the conversion element, the photoelectric conversion element that converts light into charges. However, the present invention is not limited to this. A direct conversion element that converts radiation directly into charges may also be used as the conversion element. This embodiment employs a PIN sensor as the photoelectric conversion element, but the present invention is not limited to this. For example, a MIS sensor may also be used as the photoelectric conversion element.

Next, the operation of the radiation detection apparatus having the above-described arrangement according to this embodiment will be explained with reference to FIGS. 1 and 7. In FIG. 7, for descriptive simplicity, HI is a voltage at which each TFT connected to each gate wiring line 110 is turned on, and LO is a voltage at which each TFT is turned off.

First, an operation in a period T1 in FIG. 7 will be explained. In this period, driving voltages Vg1 to Vg5 of the TFT 202 connected to the imaging photoelectric conversion element 201 in FIG. 1, and driving voltages Vd1 to Vd3 of the TFT 208 connected to the detection photoelectric conversion element 206 are sequentially changed to HI. As a result, the discrete electrodes 311 of the imaging photoelectric conversion elements of the pixels 106 to 108 and the discrete electrode 322 of the detection photoelectric conversion element of the pixel 107 are reset by a potential applied from the readout circuit 102 via the column signal lines 111 and the detection signal line 112, respectively.

Then, an operation in a period T2 will be explained. The period T2 is a period in which exposure to radiation is performed and the radiation dose is measured. The driving voltages Vd1 to Vd3 are intermittently changed to HI to read a signal from the detection photoelectric conversion element of the pixel 107. Accordingly, real-time measurement of the radiation dose is executed.

Finally, an operation in a period T3 will be explained. The period T3 is a period in which radiation irradiation ends and a signal from the imaging photoelectric conversion element 201 is read. In this period, the driving voltages Vd1 to Vd3 are at LO, and the driving voltages Vg1 to Vg5 are sequentially changed to HI. Accordingly, a signal from the imaging photoelectric conversion element 201 is read out.

Real-time measurement of the radiation dose which is executed in the period T2 is influenced by charges generated in the imaging photoelectric conversion element 201. More specifically, the potentials of the discrete electrodes 311 of the imaging photoelectric conversion elements 201 of the pixels 106 to 108 vary at any time during radiation irradiation. At this time, crosstalk is generated from parasitic capacitances between the detection signal line 112, and the discrete electrodes 311 of the imaging photoelectric conversion elements 201 of the pixels 107 and 108. The crosstalk is input to the readout circuit 102 through the detection signal line 112. At the time of measuring a radiation dose, no signal is read out from the imaging photoelectric conversion element 201. However, crosstalk by capacitive coupling generated between the imaging photoelectric conversion element and the detection signal line 112 is generated in accordance with charges generated in the imaging photoelectric conversion element, and a signal from the imaging photoelectric conversion element is mixed in a signal from the detection photoelectric conversion element. This signal is input to the readout circuit 102, losing the quantitativeness of measurement of the radiation dose. In this embodiment, therefore, a crosstalk-containing signal on the detection signal line is corrected by calculation in the arithmetic processing unit of the information processing unit 103, thereby calculating a signal from the radiation detection photoelectric conversion element. The calculation for correction performed in the arithmetic processing unit will be described below.

Before that, a basic concept regarding the crosstalk amount will be explained. Let P be the magnitude of a pure signal obtained from one detection photoelectric conversion element. Then, if the condition remains unchanged, it is considered that the imaging photoelectric conversion element generates a signal corresponding to the capacitance ratio between the imaging photoelectric conversion element and the detection photoelectric conversion element: (C1=the capacitance of the imaging photoelectric conversion element)/(Cd=the capacitance of the detection photoelectric conversion element). Letting Q be the magnitude of this signal, Q=P×(C1/Cd) is the amount of a signal generated from the imaging photoelectric conversion element. The amount of crosstalk applied to the detection signal line in accordance with Q when the TFT connected to the imaging photoelectric conversion element is OFF will be considered. The crosstalk amount at this time is determined by the ratio to the combined capacitance of the capacitance C1 of the photoelectric conversion element and a parasitic capacitance Cp. Thus, crosstalk from the imaging photoelectric conversion element=Q×(Cp/(C1+Cp)).

From this, the magnitude of a signal P' that contains crosstalk generated from the imaging photoelectric conversion element 201 to the detection signal line 112 and is provided from the detection signal line to the readout circuit 102 is given by:

$$P' = P + Q \times (Cp/(C1 + Cp))$$
$$= P + P \times (C1/Cd) \times (Cp/(C1 + Cp))$$

In the above way, the influence of crosstalk by the imaging photoelectric conversion element that is generated in the pixel 2 can be represented. Based on this concept, the amount of crosstalk generated in one unit formed from the blocks A, B, and C in FIG. 2 will be considered. Assume that radiation irradiation is uniformly performed in the blocks A, B, and C. The values of respective signals are defined as follows:

A: a signal obtained from the detection photoelectric conversion element in the block A
A': a crosstalk-containing signal obtained from the detection photoelectric conversion element in the block A
B: a signal obtained from the detection photoelectric conversion element in the block B
B': a crosstalk-containing signal obtained from the detection photoelectric conversion element in the block B
C: a signal obtained from the detection photoelectric conversion element in the block C
C': a crosstalk-containing signal obtained from the detection photoelectric conversion element in the block C
NA: the number of pixels 107 in the block A
NA': the number of pixels 108 arranged on the same column in the block A as that of the pixels 107
NB: the number of pixels 107 in the block B
NB': the number of pixels 108 arranged on the same column in the block B as that of the pixels 107 of the block A
NC: the number of pixels 107 in the block C
NC': the number of pixels 108 arranged on the same column in the block C as that of the pixels 107 in the block A
Cd: a capacitance between the common electrode and discrete electrode of the radiation detection photoelectric conversion element
C1: a capacitance between the common electrode and discrete electrode of the imaging photoelectric conversion element of the pixel 107
Cp: a parasitic capacitance between the detection signal line and the discrete electrode of the imaging photoelectric conversion element of the pixel 107
C2: a capacitance between the common electrode and discrete electrode of the imaging photoelectric conversion element of the pixel 108
Cp2: a parasitic capacitance between the detection signal line and the common electrode of the imaging photoelectric conversion element of the pixel 108 Assuming that uniform radiation enters each block, the signals A to C free from the influence of crosstalk can be estimated by calculation using the crosstalk-containing signals A' to C'.

For example, the amount of crosstalk generated from the parasitic capacitance Cp between the detection signal line and the discrete electrode 311 of the imaging photoelectric conversion element of the pixel 107 in the block A is given by:

A×(C1/Cd)×(Cp/(C1+Cp))

The amount of crosstalk generated from the parasitic capacitance Cp2 between the detection signal line and the imaging photoelectric conversion element of the pixel 108 in the block A is given by:

A×(C2/Cd)×(Cp2/(C2+Cp2))×(NA'/NA)

The influence of crosstalk from the pixels 108 in the blocks B and C is added via the signal line to the crosstalk-containing signal A' obtained in the block A. Considering this, the crosstalk-containing signals A', B', and C' actually transported to the readout circuit are given using the signals A, B, and C from the detection elements that are generated in the blocks A, B, and C included in one unit, on the assumption that the number of pixels 107, the number of pixels 108, and the values of the above-mentioned capacitances are equal between the respective blocks:

$$A' = A + A \times (C2/Cd) \times (Cp2/(C2+Cp2)) \times (NA'/NA) +$$
$$A \times (C1/Cd) \times (Cp/(C1+Cp)) +$$
$$B \times (C2/Cd) \times (Cp2/(C2+Cp2)) \times (NB'/NB) +$$
$$C \times (C2/Cd) \times (Cp2/(C2+Cp2)) \times (NC'/NC)$$
$$B' = A \times (C2/Cd) \times (Cp2/(C2+Cp2)) \times (NA'/NA) +$$
$$B + B \times (C2/Cd) \times (Cp2/(C2+Cp2)) \times (NB'/NB) +$$
$$B \times (C1/Cd) \times (Cp/(C1+Cp)) +$$
$$C \times (C2/Cd) \times (Cp2/(C2+Cp2)) \times (NC'/NC)$$
$$C' = A \times (C2/Cd) \times (Cp2/(C2+Cp2)) \times (NA'/NA) +$$
$$B \times (C2/Cd) \times (Cp2/(C2+Cp2)) \times (NB'/NB) + C +$$
$$C \times (C2/Cd) \times (Cp2/(C2+Cp2)) \times (NC'/NC) +$$
$$C \times (C1/Cd) \times (Cp/(C1+Cp))$$

The above equations represent the relation among signals that are generated in pixels, from which no signal is read out, when the TFT 202 connected to the imaging photoelectric conversion element is OFF, and contain parasitic capacitances (more specifically, Cp and Cp2) between the discrete electrodes and the detection signal line.

As for NA, NB, NC, NA', NB', NC', Cd, C1, Cp, Cp2, and C2, for example, information at the time of design is written in advance in the capacitance information storage unit of the information processing unit 103. In the example of the block A of FIG. 2, NA=3, NA'=6, NB=3, NB'=9, NC=3, and NC'=9. Similarly, the numbers of pixels in the blocks B and C and the capacitance values are obtained.

Pieces of the information of the signals A' to C' sent from the readout circuit 102 are written and stored in the output data storage unit 116. After that, the arithmetic processing unit 117 communicates with the capacitance information storage unit 118 and the output data storage unit 116, solves the above simultaneous equations, and can obtain the signals A to C in which the crosstalk amount has been corrected.

In this manner, a signal sent from the detection photoelectric conversion element 206 of the pixel 107 is provided to the arithmetic processing unit 117 in the information processing unit 103 via the readout circuit 102. The information processing unit 103 performs the above-described calculation, thereby correcting crosstalk. As a result, the radiation dose can be measured at high accuracy. When the measurement value of the integrated irradiation amount does not reach a predetermined set value, a signal from the detection photoelectric conversion element 206 is read out again, and the arithmetic processing unit in the information processing unit 103 executes correction of crosstalk, obtaining the radiation dose. If the measurement value reaches the set value, the measurement of the radiation dose ends. After that, a control signal may be sent to the radiation source to stop the radiation irradiation.

Note that this embodiment describes that NA, NB, NC, NA', NB', NC', Cd, C1, Cp, Cp2, and C2 are obtained from information at the time of design. However, as for Cd, C1, Cp, Cp2, and C2, calibration data may be acquired in advance to calculate them. For example, the discrete electrodes of the imaging photoelectric conversion elements 201 of the pixels 106 to 108, and the discrete electrode of the detection photoelectric conversion element 206 of the pixel 107 are reset to a reset potential. Then, the potentials of the respective wiring lines are caused to vary, and charges of a given amount are stored in Cd, C1, Cp, Cp2, and C2 and read out, as needed. By using the charge Q read out at that time and an actually applied bias voltage V, Cd, C1, Cp, Cp2, and C2 may be calculated from the capacitance-voltage relation: Q=CV. The capacitance information calculated at this time is transferred to the capacitance information storage unit 118 in the information processing unit. The arithmetic processing unit 117 can exchange data with the capacitance information storage unit 118, as needed. Calibration data is acquired by causing the potential of the wiring line to vary. In addition to this method, for example, charges generated upon incidence of light may be read out to acquire capacitance information.

This embodiment has described the case of charge readout. However, in the case of voltage readout, since the column signal line floats, even the parasitic capacitance between the column signal line and the driving wiring line cannot be ignored in the above-mentioned calculation equations. In this case, a value considering even the parasitic capacitance between the column signal line and the gate driving wiring line is applied to Cp and Cp2 in the above-mentioned calculation equations.

In this embodiment, a combination of the imaging photoelectric conversion element and TFT, and a combination of the radiation detection photoelectric conversion element and TFT have been described in regard to the arrangement of the pixel 107 including the detection photoelectric conversion element. However, the present invention is not limited to this. A portion equivalent to the pixel 107 may be a detection unit constituted by only a combination of the detection photoelectric conversion element and TFT, or constituted by only the detection photoelectric conversion element having no TFT. Although this embodiment has described that the size of the pixel 107 is equal to those of the pixels 106 and 108, the present invention is not limited to this. The size is arbitrary as long as the radiation incident amount can be measured. For example, the size of the pixel 107 may be equal to or larger than a size corresponding to the two, pixels 106 and 108.

(Second Embodiment)

Figure 8:
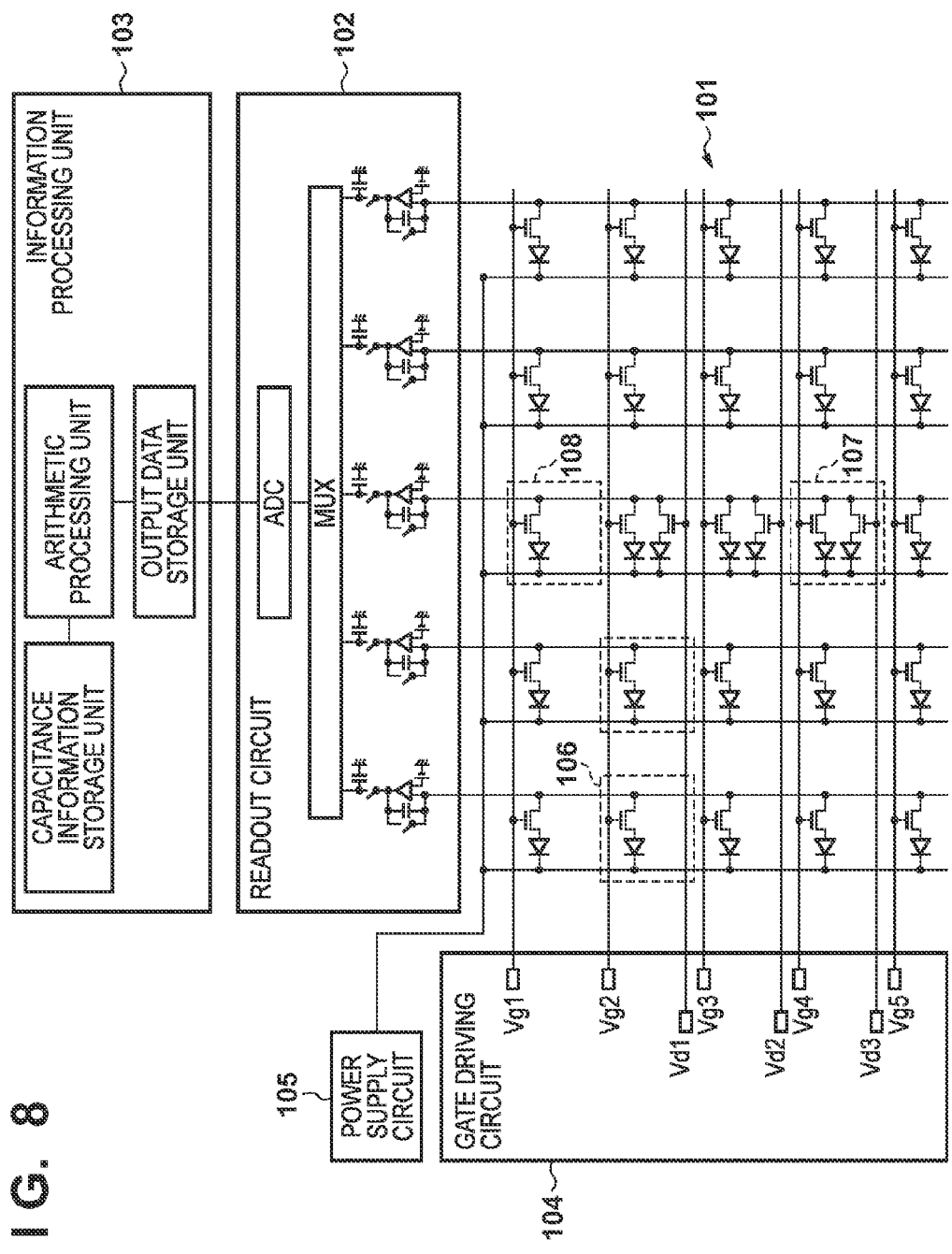
FIG. 8 is an equivalent circuit diagram showing a radiation imaging apparatus according to the second embodiment.

Next, the second embodiment of the present invention will be described. Note that a description of duplication of the first embodiment will not be repeated. FIG. 8 is an equivalent circuit diagram showing the circuit arrangement of a radiation detection apparatus according to the second embodiment of the present invention. In the first embodiment, the detection photoelectric conversion element 206 is connected to the detection signal line 112 via the TFT 208. In the second embodiment, a detection photoelectric conversion element 206 is connected to a column signal line 111 via a TFT 208. That is, the column signal line also operates as the detection signal line. As for a pixel 108 in FIG. 8, the detection signal line of the pixel 107 is wired inside the pixel 108 in the first embodiment. In the second embodiment, however, since there is no detection signal line, the internal arrangement of the pixel 108 is the same as the arrangement of a pixel 106. Therefore, the pixel 106 in the second embodiment indicates a pixel connected to the column signal line 111 to which the detection photoelectric conversion element of a pixel 107 is not connected. The arrangement of the pixel 106 is the same as that in the first embodiment. The pixel 108 according to the second embodiment indicates a pixel connected to the column signal line 111 to which at least one detection photoelectric conversion element included in the pixel 107 is connected. As a result, the structure of the pixel 108 according to this embodiment is the same as that of the pixel 106. FIG. 8 shows an example in which 5 (rows)×5 (columns) pixels are provided in a pixel area 101. However, the number of pixels is not limited to this.

Figure 9:
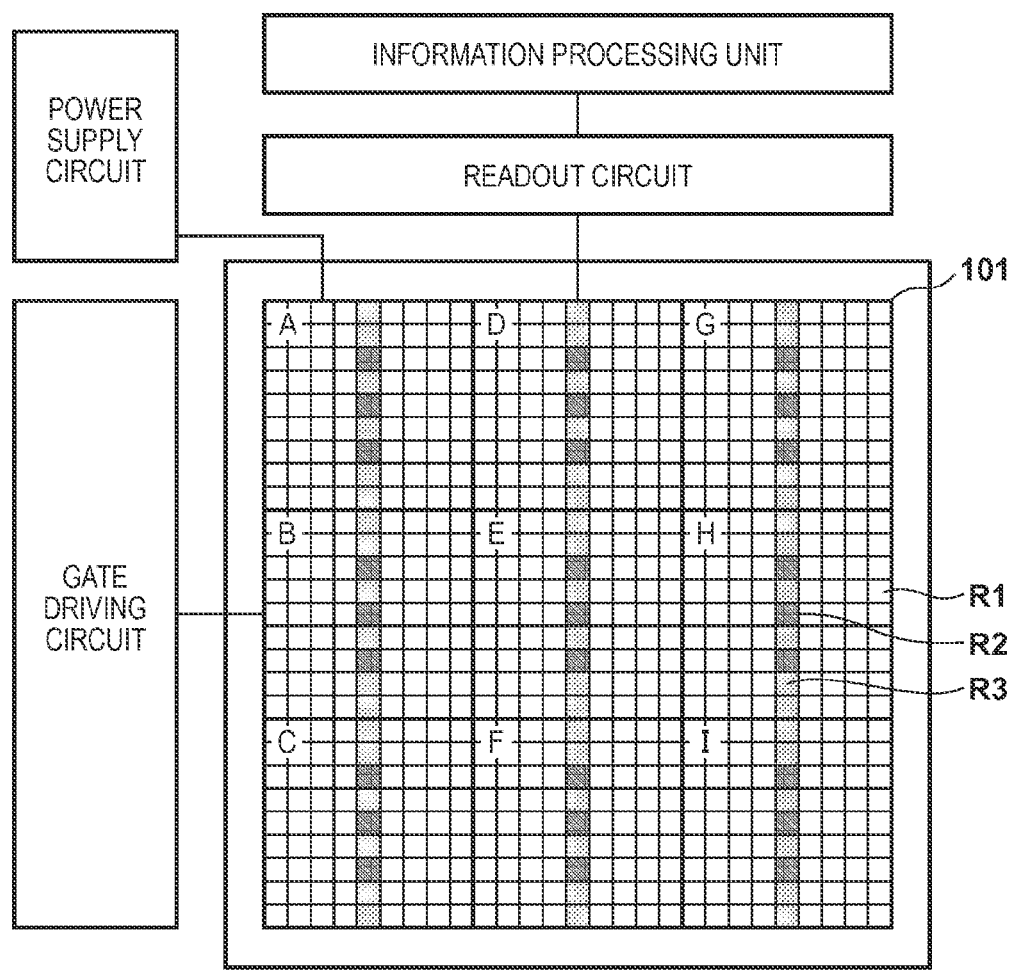
FIG. 9 is a view showing the layout of the radiation imaging apparatus according to the second embodiment.

When a circuit having the arrangement as shown in FIG. 8 is applied to, for example, a radiation detection apparatus including 27×27 pixels, it can be arranged as shown in FIG. 9. FIG. 10 is an equivalent circuit diagram showing the portion of a block A in FIG. 9. The pixel area in FIG. 9 includes a region R1 where the pixels 106 are gathered, a region R2 where the pixels 107 are gathered, and a region R3 where the pixels 108 are gathered. Although the regions R2 exist in nine blocks A to I in the pixel area 101, the number and layout of the regions R2 are not limited to this. For example, R2 may be provided separately in 5×5=25 regions in accordance with the pixel area, or provided in 10×10=100 regions. As for the layout of the regions R2 at this time, the regions R2 may be laid out uniformly in the pixel area, or may be localized to a given portion densely. In the first embodiment, the regions R2 are arranged by shifting their positions in different blocks in the column direction. In the second embodiment, the regions R2 are arranged to overlap each other in different blocks in the column direction.

Figure 11A:
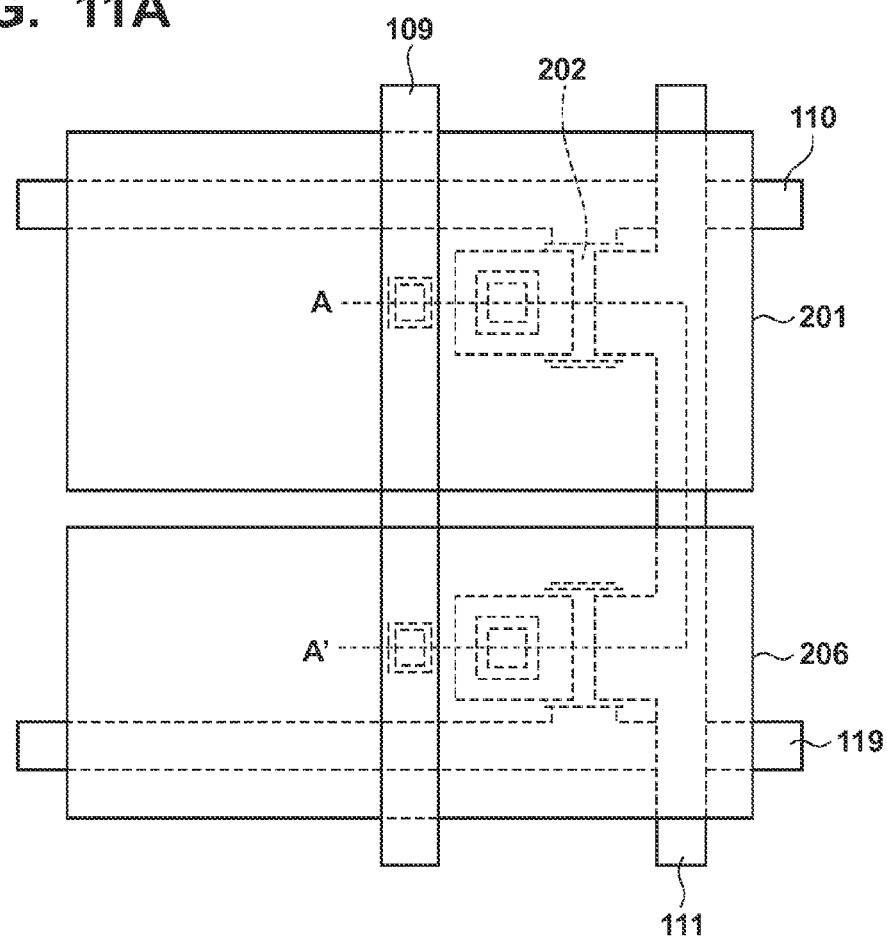
FIGS. 11A and 11B are schematic views showing a pixel 107 according to the second embodiment.
Figure 11B:
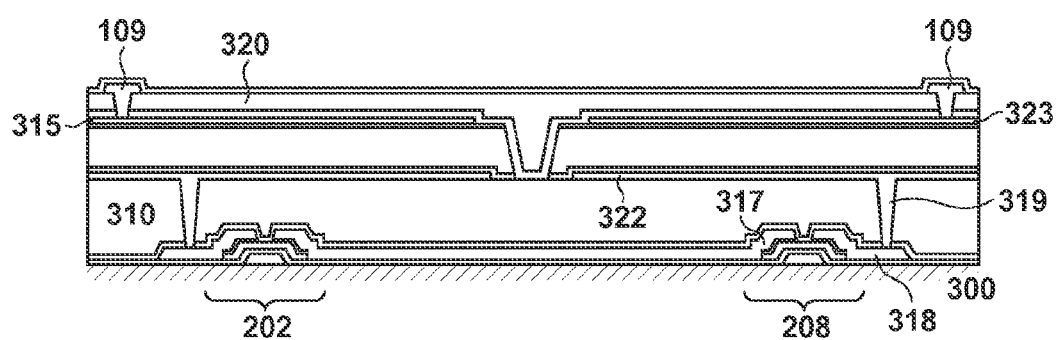

Next, the arrangement of pixels will be explained. Note that the pixels 106 and 108 are the same as those in the first embodiment, and a description thereof will not be repeated. FIG. 11A shows the planar structure of the pixel 107 according to this embodiment, and FIG. 11B is a sectional view taken along a line A-A' in FIG. 11A. The detection photoelectric conversion element 206 is stacked and arranged on the TFT 208 provided on an insulating substrate 300 such as a glass substrate. A first main electrode 317 of the TFT 208 forms part of the column signal line 111. A second main electrode 318 of the TFT 208 is connected to a discrete electrode 322 of the detection photoelectric conversion element via a contact formed in a contact hole 319. A bias line 109 arranged on a second interlayer insulation layer 320 is electrically joined to a common electrode 315 of the imaging photoelectric conversion element and a common electrode 323 of the detection photoelectric conversion element. The discrete electrode of the detection photoelectric conversion element 206 and the discrete electrode of an imaging photoelectric conversion element 201 are connected to a readout circuit 102 via the common column signal line 111.

The operation of the radiation detection apparatus according to this embodiment will be explained with reference to FIGS. 8 and 12. An operation in a period T1 is the same as that in the first embodiment. A period T2 is a period in which the radiation dose is measured. In the first embodiment, the driving voltages Vd1 to Vd3 are simultaneously and intermittently changed to ON. In the second embodiment, however, the pixels 107 for detecting radiation in a plurality of blocks are connected to one column signal line, as shown in FIG. 9. In order to extract signals from each block, ON voltages Vd1 to Vd3 are sequentially applied to the gates of the detection optical elements in each block. Then, the signal of the radiation detection photoelectric conversion element is read. An operation in a period T3 is the same as that in the first embodiment.

As in the first embodiment, calculation for correcting crosstalk by an arithmetic processing unit is executed on the thus-read signal from the radiation detection photoelectric conversion element. In the second embodiment, the calculation equations are as follows. Note that the respective variables are the same as those in the first embodiment. Assuming that uniform radiation enters each block, signals A to C free from the influence of crosstalk from the detection element can be estimated by calculation using crosstalk-containing signals A' to C'.

For example, the amount of crosstalk generated from a parasitic capacitance Cp between the detection signal line and the discrete electrode of the imaging photoelectric conversion element of the pixel 107 in the block A is given by:

$$A \times (C1/Cd) \times (Cp/(C1+Cp))$$

The amount of crosstalk generated from the parasitic capacitance Cp2 between the detection signal line and the imaging photoelectric conversion element of the pixel 108 in the block A is given by:

$$A \times (C2/Cd) \times (Cp2/(C2+Cp2)) \times (NA'/NA)$$

When reading out the block A, TFTs connected to the detection photoelectric conversion elements of the pixels 107 in the blocks B and C are OFF. Thus, crosstalk arising from a parasitic capacitance Cp3 between the discrete electrode and the detection signal line is given by:

$$B \times (Cp3/(Cd+Cp3))$$

$$C \times (Cp3/(Cd+Cp3))$$

Hence, for example, the signal A' is influenced by crosstalk from the pixels 107 and 108 in the block A and crosstalk from the pixels 107 and 108 in the blocks B and C. In practice, the crosstalk-containing signals A', B', and C' input to the readout circuit are given using the pure signals A, B, and C from the radiation detection photoelectric conversion elements, on the assumption that the number of pixels 107, the number of pixels 108, and the values of the above-mentioned capacitances are equal between the respective blocks:

$$A' = A + A \times (C2/Cd) \times (Cp2/(C2+Cp2)) \times (NA'/NA) +$$
$$A \times (C1/Cd) \times (Cp/(C1+Cp)) +$$
$$B \times (C2/Cd) \times (Cp2/(C2+Cp2)) \times (NB'/NB) +$$
$$B \times (C1/Cd) \times (Cp/(C1+Cp)) + B \times (Cp3/(Cd+Cp3)) +$$
$$C \times (C2/Cd) \times (Cp2/(C2+Cp2)) \times (NC'/NC) +$$
$$C \times (C1/Cd) \times (Cp/(C1+Cp)) + C \times (Cp3/(Cd+Cp3))$$
$$B' = A \times (C2/Cd) \times (Cp2/(C2+Cp2)) \times (NA'/NA) +$$
$$A \times (C1/Cd) \times (Cp/(C1+Cp)) + A \times (Cp3/(Cd+Cp3)) +$$
$$B + B \times (C2/Cd) \times (Cp2/(C2+Cp2)) \times (NB'/NB) +$$
$$B \times (C1/Cd) \times (Cp/(C1+Cp)) +$$
$$C \times (C2/Cd) \times (Cp2/(C2+Cp2)) \times (NC'/NC) +$$
$$C \times (C1/Cd) \times (Cp/(C1+Cp)) + C \times (Cp3/(Cd+Cp3))$$
$$C' = A \times (C2/Cd) \times (Cp2/(C2+Cp2)) \times (NA'/NA) +$$

$$A \times (C1/Cd) \times (Cp/(C1+Cp)) + A \times (Cp3/(Cd+Cp3)) +$$
$$B \times (C2/Cd) \times (Cp2/(C2+Cp2)) \times (NB'/NB) +$$
$$B \times (C1/Cd) \times (Cp/(C1+Cp)) + B \times (Cp3/(Cd+Cp3)) +$$
$$C + C \times (C2/Cd) \times (Cp2/(C2+Cp2)) \times (NC'/NC) +$$
$$C \times (C1/Cd) \times (Cp/(C1+Cp))$$

As in the first embodiment, the above equations are equations including crosstalk arising from capacitances (more specifically, Cp, Cp2, and Cp3) between the detection signal line and the discrete electrodes of the photoelectric conversion elements of pixels from which no signal is read out. An arithmetic processing unit 117 solves the above simultaneous equations, and can obtain signals from the radiation detection photoelectric conversion elements. As a result, quantitative measurement of the radiation dose becomes possible.

(Third Embodiment)

Figure 13:
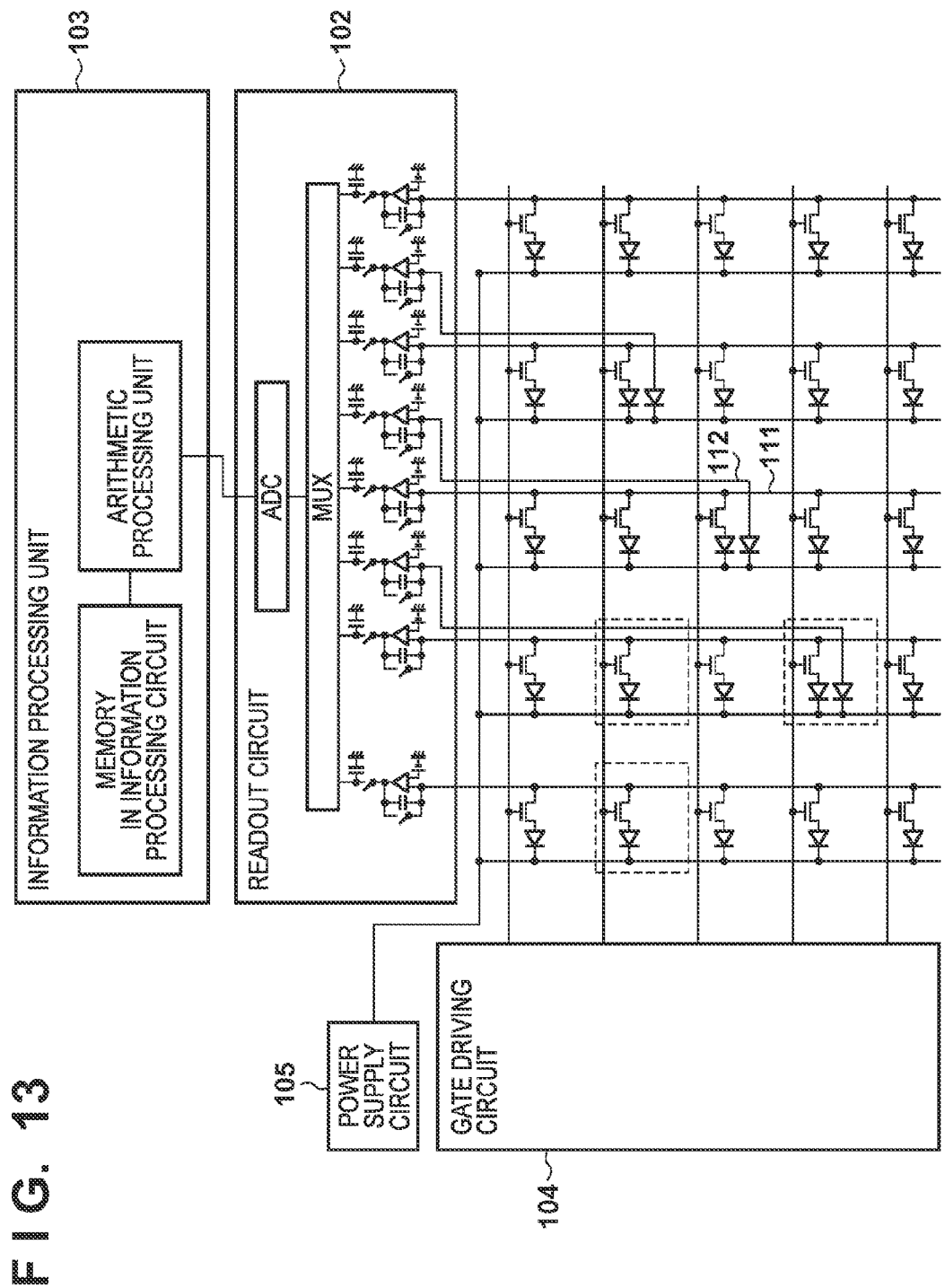
FIG. 13 is an equivalent circuit diagram showing a radiation imaging apparatus according to the third embodiment of the present invention.

Next, the third embodiment of the present invention will be described. FIG. 13 is an equivalent circuit diagram showing a radiation detection apparatus according to the third embodiment. In this embodiment, the detection photoelectric conversion element of a pixel 107 is connected to a detection signal line 112 without intervention of a TFT. In addition, an information processing unit 103 performs irradiation region determination to determine a portion irradiated with radiation in a pixel area 101.

Figure 14:
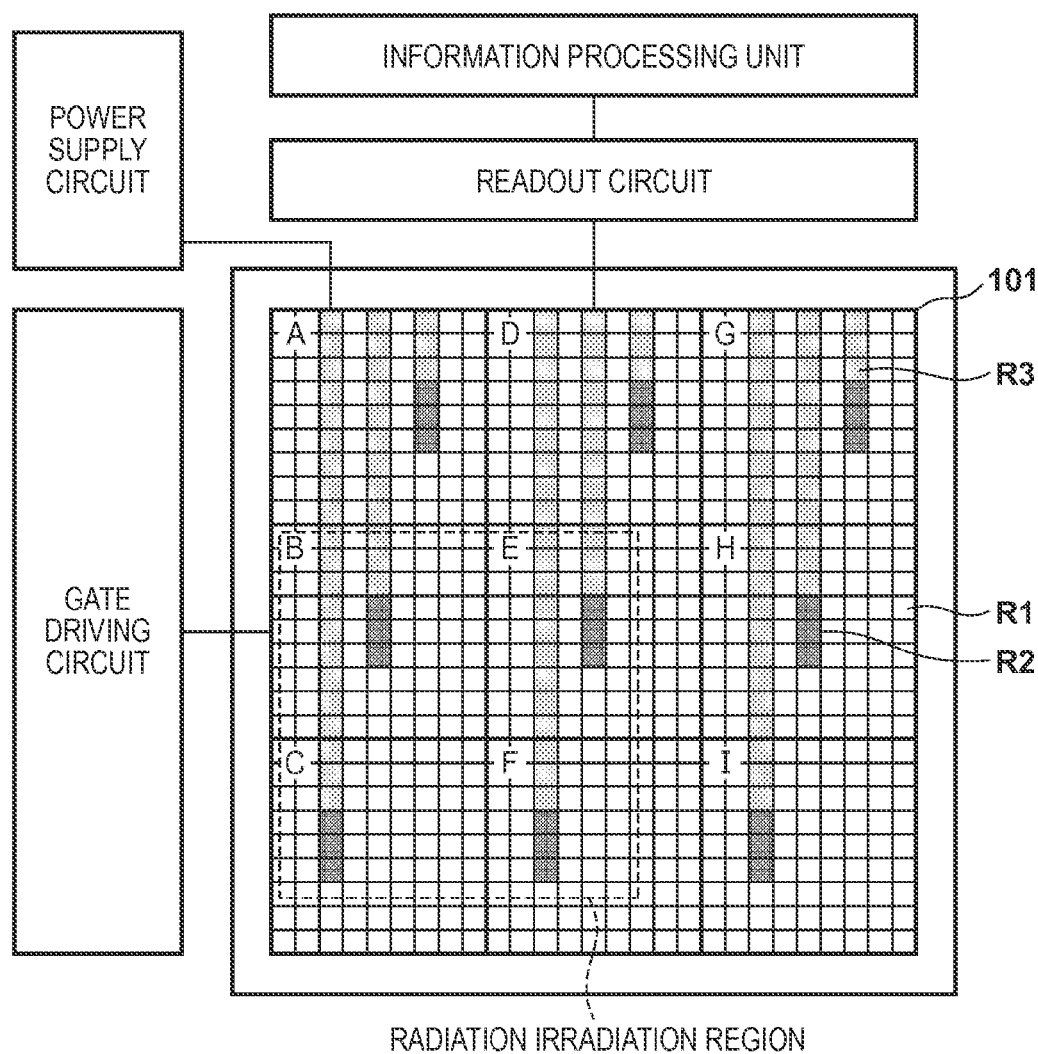
FIG. 14 is a view showing the layout of the radiation imaging apparatus according to the third embodiment of the present invention.
Figure 15:
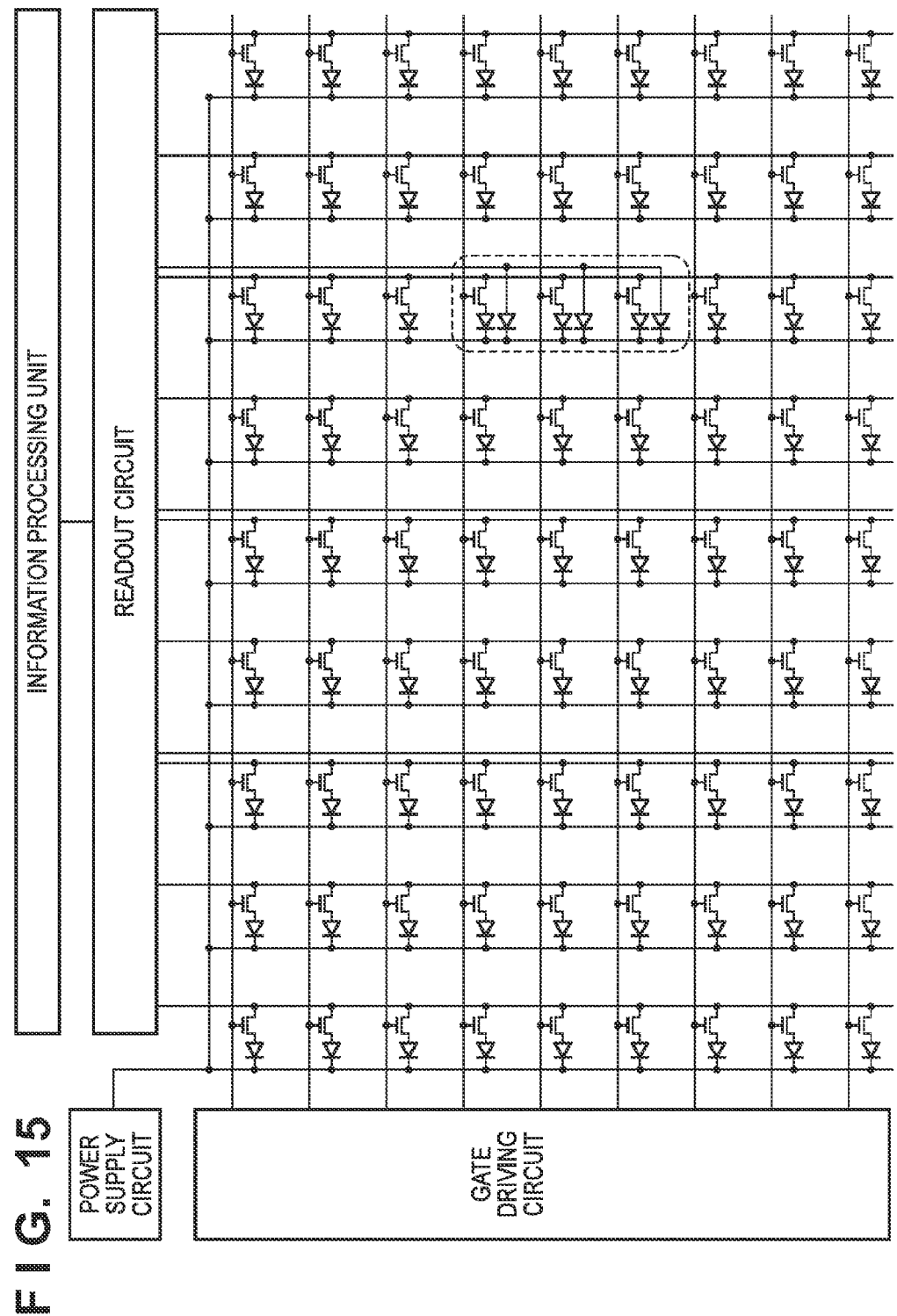
FIG. 15 is an enlarged view showing a block A in FIG. 14.

When a circuit having the arrangement as shown in FIG. 13 is applied to, for example, a radiation detection apparatus including 27×27 pixels, an arrangement as shown in FIG. 14 is obtained. FIG. 15 is an equivalent circuit diagram showing a block A in FIG. 14. The pixel area 101 in FIGS. 14 and 15 includes a region R1 where pixels 106 are gathered, a region R2 where the pixels 107 are gathered, and a region R3 where pixels 108 are gathered. Although 3×3=9 regions R2 exist in the pixel area, the number and layout of the regions R2 are not limited to this example. For example, 5×5=25 regions R2 may be provided in accordance with the pixel area, or 10×10=100 regions R2 may be provided. As for the layout of the regions R2 at this time, the regions R2 may be laid out uniformly in the pixel area, or may be localized to a given portion densely. In FIGS. 14 and 15, detection signal lines 112 are wired up to the bottom row, viewed from a readout circuit 102, on which the pixel 107 is arranged.

Figure 16A:
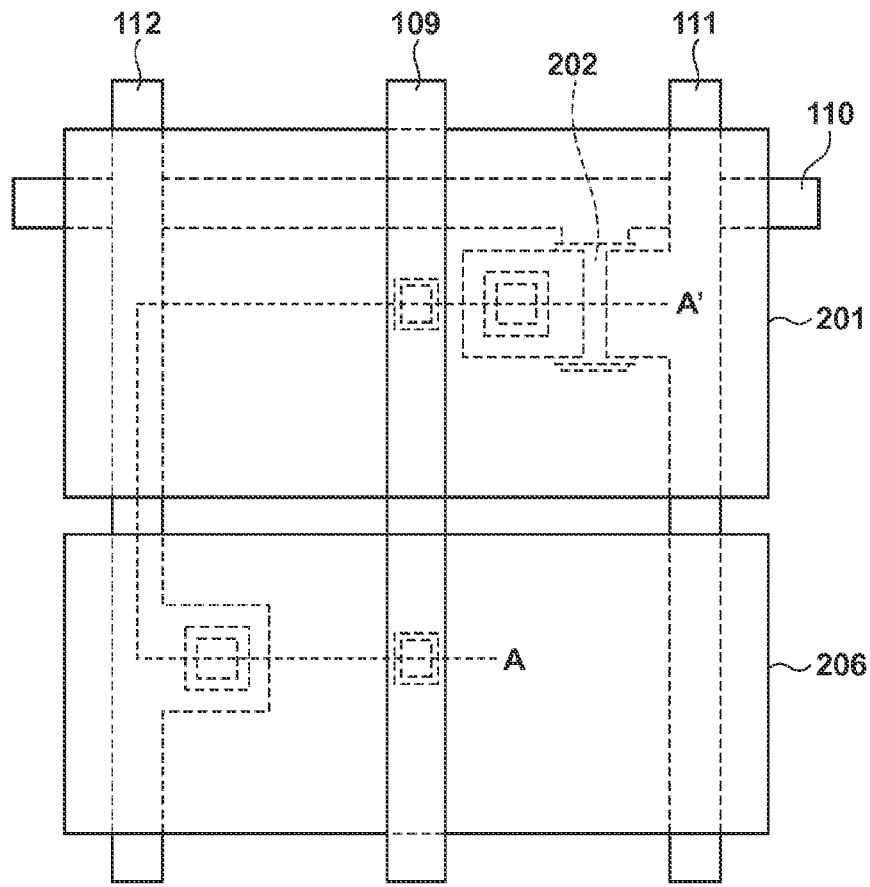
FIGS. 16A and 16B are schematic views showing a pixel 107 according to the third embodiment.
Figure 16B:
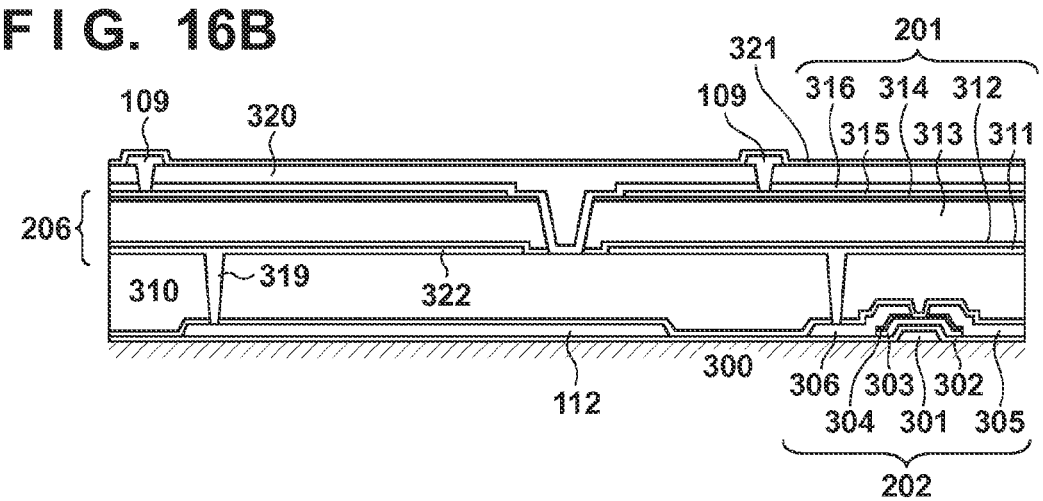

Next, the arrangement of pixels will be explained. Note that the pixels 106 and 108 are the same as those in the first embodiment, and a description thereof will not be repeated. FIG. 16A shows the planar structure of the pixel 107 according to this embodiment, and FIG. 16B is a sectional view taken along a line A-A' in FIG. 16A. A detection photoelectric conversion element 206 is arranged on a first interlayer insulation layer 310. A discrete electrode 322 of the detection photoelectric conversion element 206 is connected to the detection signal line 112 via a contact formed in a contact hole 319.

The operation of the radiation detection apparatus according to this embodiment will be explained. A case in which a portion indicated by a broken line in FIG. 14 is irradiated with radiation will be examined. The radiation exposure field spans four blocks B, C, E, and F, and the remaining five blocks A, D, G, H, and I form a non-irradiation region. Therefore, outputs obtained from the regions R2 included in the five blocks out of the radiation exposure field can become almost 0. At this time, an irradiation region determination unit connected to an arithmetic processing unit determines that a block whose output is almost 0 is a non-irradiation region. A block determined as a non-irradiation region is excluded from targets of arithmetic processing for correction. Then, arithmetic processing for correction is performed using a signal from the exposure field. The number of variables can be decreased by restricting blocks to undergo arithmetic processing. This is advantageous for speeding up the operation.

Calculation equations in the arithmetic processing unit according to this embodiment will be described below. Calculation equations for the blocks A, B, and C are as follows:

$$A' = A + A \times (C2/Cd) \times (Cp2/(C2+Cp2)) \times (NA'/NA) +$$
$$A \times (C1/Cd) \times (Cp/(C1+Cp))$$
$$B' = A \times (C2/Cd) \times (Cp2/(C2+Cp2)) \times (NA'/NA) +$$
$$B + B \times (C2/Cd) \times (Cp2/(C2+Cp2)) \times (NB'/NB) +$$
$$B \times (C1/Cd) \times (Cp/(C1+Cp))$$
$$C' = A \times (C2/Cd) \times (Cp2/(C2+Cp2)) \times (NA'/NA) +$$
$$B \times (C2/Cd) \times (Cp2/(C2+Cp2)) \times (NB'/NB) + C +$$
$$C \times (C2/Cd) \times (Cp2/(C2+Cp2)) \times (NC'/NC) +$$
$$C \times (C1/Cd) \times (Cp/(C1+Cp))$$

Since the signal A=0 can be set for the block A in accordance with the above equations in this embodiment, the arithmetic processing unit suffices to consider only the signal B' of the block B and the signal C' of the block C. The load of arithmetic processing is decreased, and this is advantageous for speeding up a series of operations at the time of measuring the radiation dose.

(Fourth Embodiment)

Figure 17:
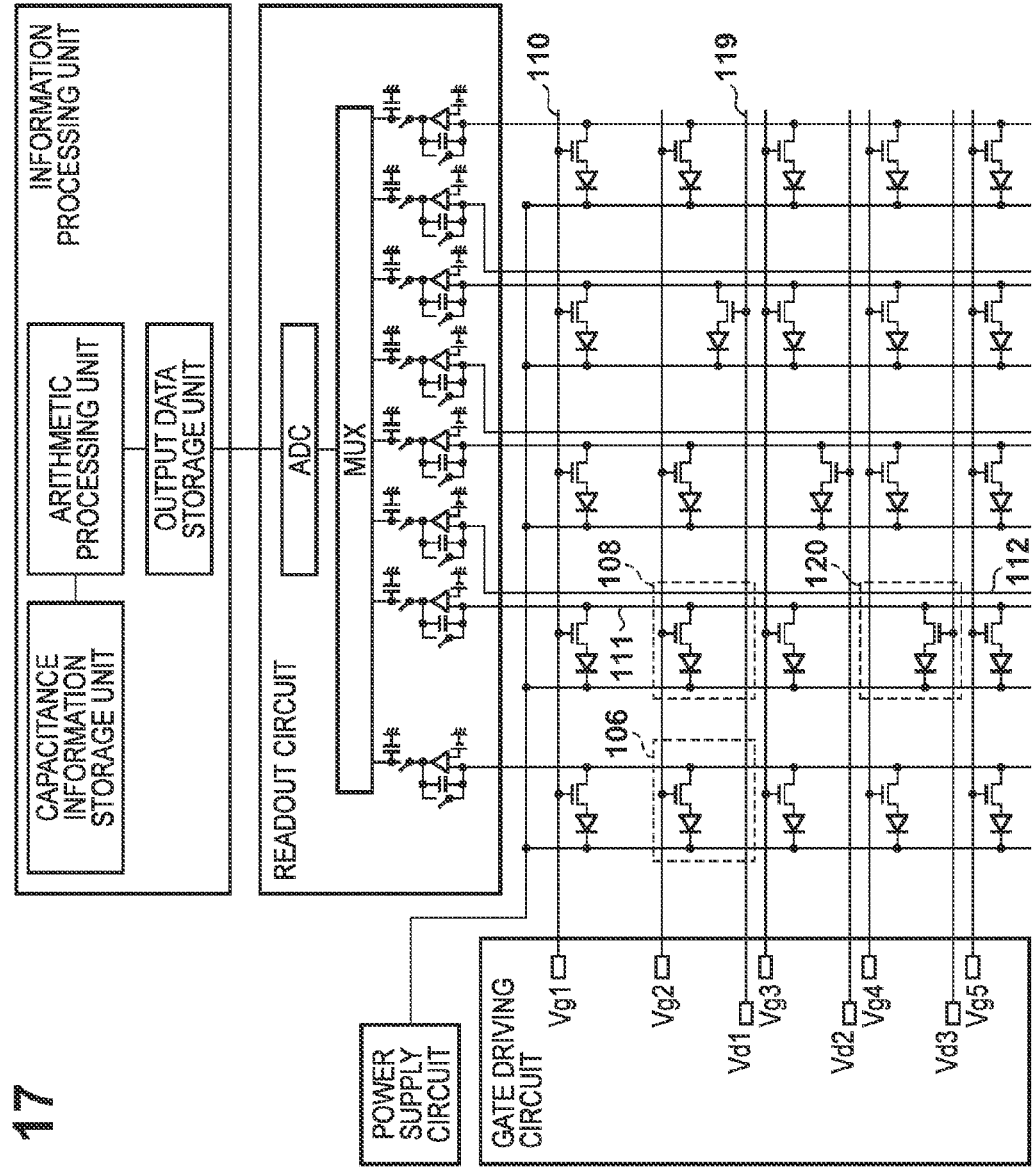
FIG. 17 is an equivalent circuit diagram showing a radiation imaging apparatus according to the fourth embodiment of the present invention.

Next, the fourth embodiment of the present invention will be described. Note that a description of duplication of the first embodiment will not be repeated. FIG. 17 is an equivalent circuit diagram showing a radiation detection apparatus according to the fourth embodiment. In the fourth embodiment, unlike the first embodiment, a detection element 120 including no imaging photoelectric conversion element is arranged at a portion where a pixel is arranged, as shown in FIG. 17. The detection element 120 is constituted by a combination of a detection photoelectric conversion element and a TFT.

Figure 18A:
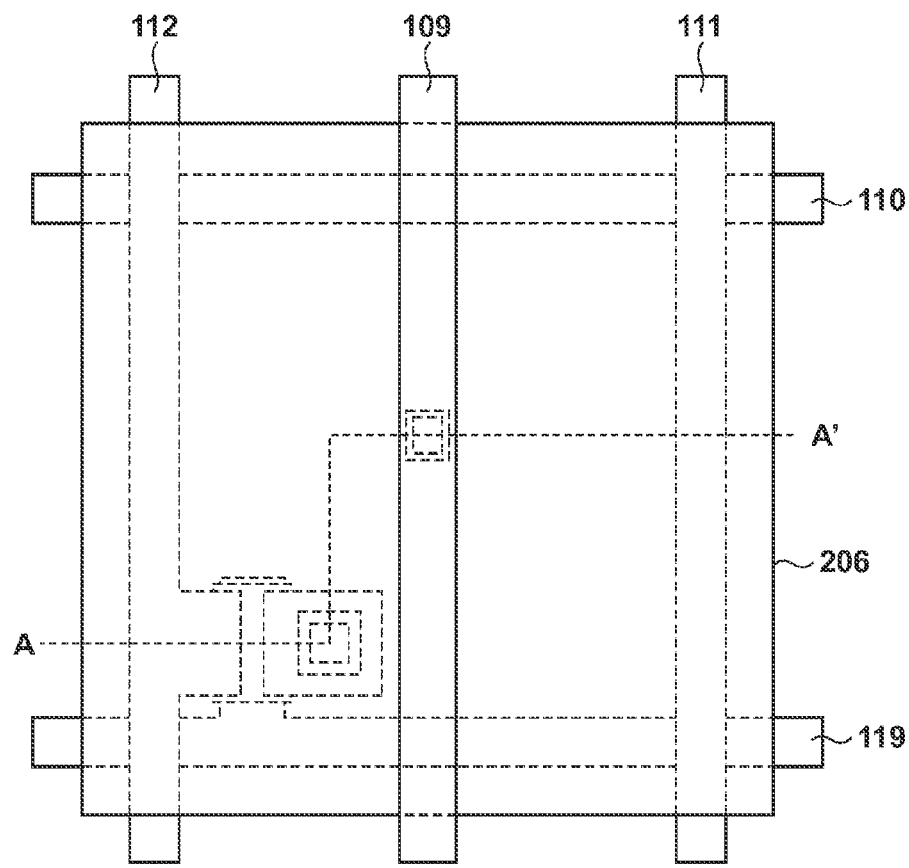
FIGS. 18A and 18B are a plan view and sectional view, respectively, showing a pixel 107 according to the fourth embodiment of the present invention.
Figure 18B:
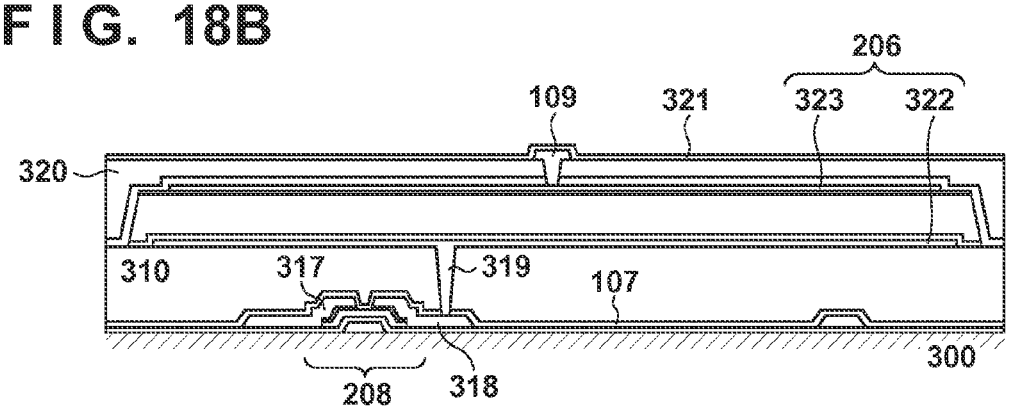

FIG. 18A is a plan view showing the detection element 120 according to this embodiment, and FIG. 18B is a sectional view taken along a line A-A' in FIG. 18A. The detection element 120 according to this embodiment is connected to a detection signal line 112 via a TFT 208 connected to the detection photoelectric conversion element. A column signal line 111 running from a pixel 108 is wired inside the detection element 120. The detection signal line 112 is wired inside the pixel 108. The detection photoelectric conversion element is stacked and arranged on the TFT 208 provided on an insulating substrate 300 such as a glass substrate. A first main electrode 317 of the TFT 208 forms part of the detection signal line 112. A second main electrode 318 of the TFT 208 is connected to a discrete electrode 322 of the detection photoelectric conversion element via a contact formed in a contact hole 319. A bias line 109 arranged on a second interlayer insulation layer 320 is electrically joined to a common electrode 323 of a detection photoelectric conversion element 206.

The operation of the radiation detection apparatus according to the fourth embodiment is the same as that according to the first embodiment. However, in the fourth embodiment, unlike the first embodiment, crosstalk from the imaging photoelectric conversion element of a pixel 107 according to the first embodiment need not be considered because there is no pixel including an imaging photoelectric conversion element and a detection photoelectric conversion element, like the pixel 107. It is only necessary to perform correction by taking account of crosstalk to the detection signal lines from the pixel 108 and a pixel 106. More specifically, assuming that radiation uniformly enters each block, crosstalk-containing signals A', B', and C' are given by:

$$A' = A + A \times (C2/Cd) \times (Cp2/(C2+Cp2)) \times (NA'/NA) +$$
$$B \times (C2/Cd) \times (Cp2/(C2+Cp2)) \times (NB'/NB) +$$
$$C \times (C2/Cd) \times (Cp2/(C2+Cp2)) \times (NC'/NC)$$
$$B' = A \times (C2/Cd) \times (Cp2/(C2+Cp2)) \times (NA'/NA) +$$
$$B + B \times (C2/Cd) \times (Cp2/(C2+Cp2)) \times (NB'/NB) +$$
$$C \times (C2/Cd) \times (Cp2/(C2+Cp2)) \times (NC'/NC)$$
$$C' = A \times (C2/Cd) \times (Cp2/(C2+Cp2)) \times (NA'/NA) +$$
$$B \times (C2/Cd) \times (Cp2/(C2+Cp2)) \times (NB'/NB) +$$
$$C + C \times (C2/Cd) \times (Cp2/(C2+Cp2)) \times (NC'/NC)$$

From the above equations, the values of the detection signals of the blocks A, B, and C can be obtained, as in the other embodiments.

(Fifth Embodiment)

Figure 19:
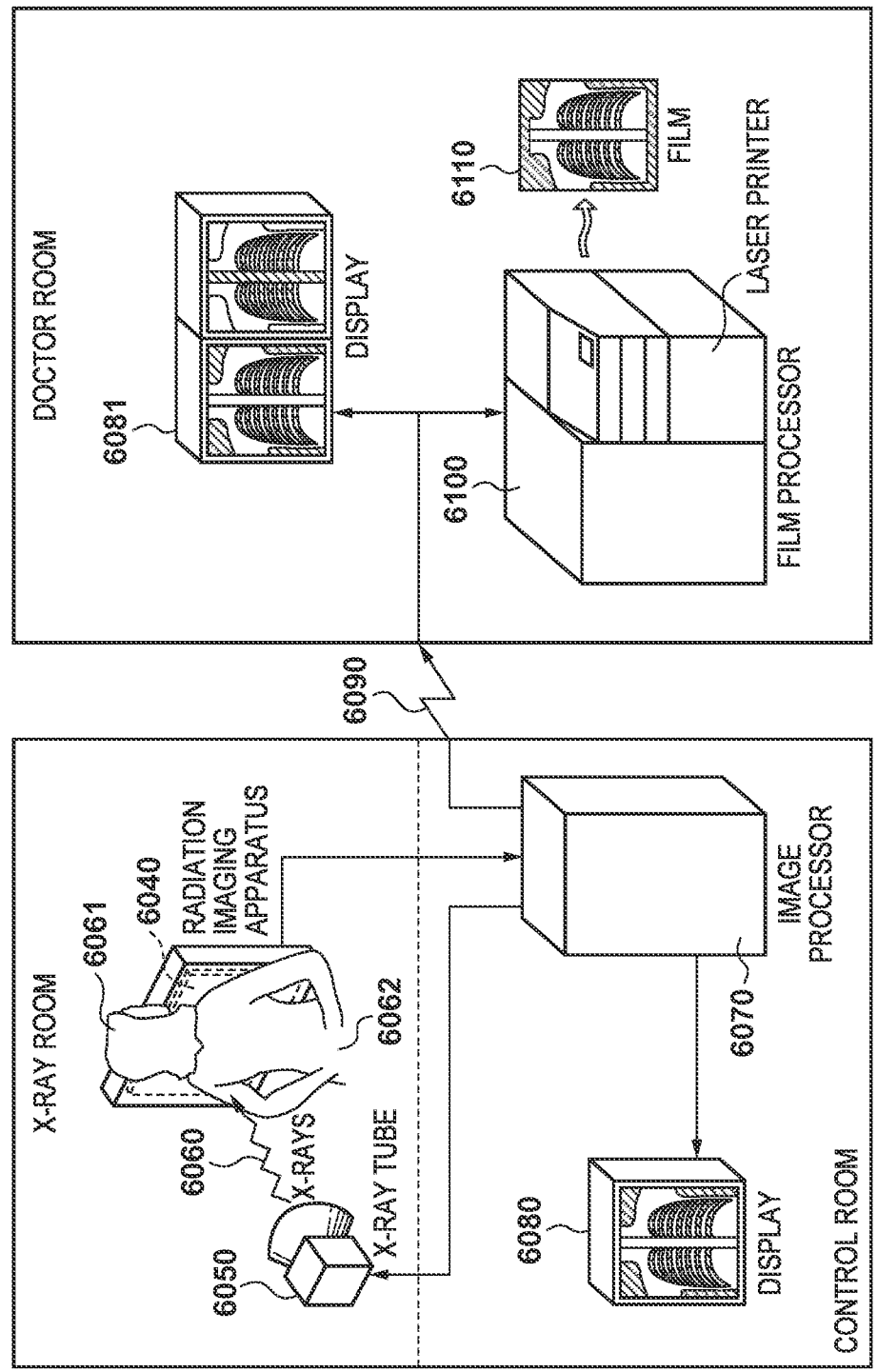
FIG. 19 is a conceptual view showing a radiation imaging system according to an embodiment of the present invention.

Next, a radiation imaging system using a radiation imaging apparatus according to this embodiment will be explained with reference to FIG. 19. X-rays 6060 generated by an X-ray tube 6050 serving as a radiation source pass through a chest 6062 of a patient or object 6061 and enter the photoelectric conversion unit of the radiation imaging apparatus according to the present invention that is included in a radiation detection apparatus 6040. The incident X-rays include information about the inside of the body of the object 6061. The photoelectric conversion unit converts the radiation into charges in accordance with the entrance of the X-rays, obtaining electrical information. This information is converted into digital data, undergoes image processing by an image processor 6070 serving as a signal processing unit, and can be observed on a display 6080 serving as a display unit in a control room.

Also, this information can be transferred to a remote place by a transmission processing unit such as a telephone line 6090, and can be displayed on a display 6081 serving as a display unit in a doctor room or the like at another place, or can be saved on a recording unit such as an optical disk. Even a doctor at the remote place can make a diagnosis. A film processor 6100 serving as a recording unit can also record the information on a film 6110 serving as a recording medium.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-160798, filed Aug. 6, 2014, which is hereby incorporated by reference herein in its entirety.

What is claimed is:

1. A radiation imaging apparatus comprising:
a conversion element configured to generate an image signal corresponding to radiation
a detection element configured to detect radiation;
a detection signal line connected to the detection element; and
a processing unit,
wherein the processing unit performs calculation of a signal from the detection element, during a period in which exposure of radiation is being performed, for at least one of detecting a start of irradiation of radiation and measuring amount of irradiation, and
the calculation is performed based on a signal provided from the detection signal line, a capacitance of the conversion element, a parasitic capacitance between the conversion element and the detection signal line, and a capacitance of the detection element.

2. The apparatus according to claim 1, wherein the calculation is performed based on a value of a capacitance of the conversion element, a value of a capacitance of the detection element, a value of the parasitic capacitance, the number of detection elements connected to the detection signal line, and the number of conversion elements which generate the parasitic capacitance between the conversion element and the detection signal line.

3. The apparatus according to claim 1, further comprising a switching element connected between the conversion element and a column signal line, wherein the column signal line also operates as the detection signal line.

4. The apparatus according to claim 1, wherein a unit is constituted by arranging blocks which include the conversion element and a detection signal line in line along the detection signal line, and a signal from the detection element of a block falling outside a radiation exposure field out of the blocks, is not used for the calculation.

5. The apparatus according to claim 1, wherein a unit is constituted by arranging blocks which include the conversion element and a detection signal line in line along the detection signal line, and a plurality of units are arranged in a direction perpendicular to a column of the blocks.

6. A radiation imaging system comprising:
a radiation source that generates radiation; and
a radiation imaging apparatus according to claim 1.

7. The system according to claim 6, wherein said radiation source is controlled based on a control signal from an information processing unit.

8. The apparatus according to claim 1, wherein the apparatus comprises a pixel array arranged a plurality of pixels in matrix, and the pixel array comprises a first pixel and a second pixel,
wherein the first pixel includes the detection element, the second pixel includes the conversion element and does not include the detection element, and the detection line is arranged along a column of the pixel array.

9. The apparatus according to claim 8, the second pixel further including a switching element connected between a column signal line arranged along the column and the conversion element,
wherein the column signal line also operates as the detection signal line.

10. The apparatus according to claim 9, the first pixel further including a switching element connected between the detection line and the detection element.

11. The apparatus according to claim 10, the first pixel further including the conversion element and a switching element connected between the conversion element and the column signal line.

12. The apparatus according to claim 8, the second pixel further including a switching element connected between the conversion element and a column signal line arranged along a column of the pixel array separately from the detection signal line,
 wherein the detection signal line is arranged between a plurality of the column signal lines.

13. The apparatus according to claim 12, the first pixel further including a switching element connected between the detection signal line and the detection element.

14. The apparatus according to claim 13, the first pixel further including a switching element connected between the conversion element and the column signal line.

15. The apparatus according to claim 1, the processing unit comprising
 a first storage unit storing capacitance information of the conversion element, the detection element, and the parasitic capacitance,
 a second storage unit storing signal information provided by the detection signal line, and
 an arithmetic processing unit connected to the first storage unit and the second storage unit for performing the calculation.

* * * * *